United States Patent [19]

Kumagai et al.

[11] Patent Number: 4,887,215

[45] Date of Patent: Dec. 12, 1989

[54] METHOD OF EXAMINING OPERATION OF ELECTRONIC CONTROL SYSTEM FOR INTERNAL COMBUSTION ENGINES

[75] Inventors: Chiaki Kumagai; Shinji Juman, both of Saitama; Yutaka Kimura; Haruhito Mitomo, both of Tokyo, all of Japan

[73] Assignee: Honda Giken Kogyo Kabushiki Kaisha, Tokyo, Japan

[21] Appl. No.: 878,571

[22] Filed: Jun. 25, 1986

[30] Foreign Application Priority Data

Jun. 25, 1985 [JP] Japan .................................. 60-136768

[51] Int. Cl.$^4$ ................................................ F02D 5/16
[52] U.S. Cl. ................................ 364/431.04; 73/117.3; 123/417; 123/428
[58] Field of Search ........................ 364/431.04, 431.11, 364/571.04, 571.07; 73/117.3, 116; 377/29, 30, 39; 371/8, 20, 25, 16; 123/478, 414, 416, 417, 428, 359

[56] References Cited

U.S. PATENT DOCUMENTS

| | | | |
|---|---|---|---|
| 4,104,990 | 8/1978 | Frobenios | 123/416 |
| 4,380,982 | 4/1983 | Kobashi | 123/414 |
| 4,385,605 | 5/1983 | Petrie et al. | 123/414 |
| 4,532,593 | 7/1985 | Mouri et al. | 371/25 |
| 4,601,199 | 7/1986 | Denz | 364/43.11 |
| 4,618,954 | 8/1986 | Otobe et al. | 371/16 |
| 4,642,773 | 2/1987 | Miyaki et al. | 364/431.05 |
| 4,656,993 | 4/1987 | Yuzawa et al. | 123/414 |
| 4,747,382 | 5/1988 | Suzuki et al. | 123/414 |
| 4,748,952 | 6/1988 | Yagi et al. | 123/417 |

OTHER PUBLICATIONS

Unterlagan et al., "Digital Engine Electronics Control Ignition and Fuel Injection", Electronic, vol. 28, No. 21, pp. 39–42, Oct. 18, 1978.

Primary Examiner—Parshotam S. Lall
Assistant Examiner—Ellis B. Ramirez
Attorney, Agent, or Firm—Lyon & Lyon

[57] ABSTRACT

A method of examining operation of an electronic control system for an internal combustion engine having a crankshaft, the control system having a mechanism for generating pulse signals indicative of angular position of the crankshaft and a processing circuit for evaluating the indicative pulse signals so as to output pulse signals for controlling an engine operation-related factor. The mechanism generates each indicative pulse signal at a time when the crankshaft is at one of predetermined angular positions. The processing circuit outputs each control pulse signal when the crankshaft is at a desired angular position. According to the method, the indicative pulse signals are continuously counted so as to generate a succession of counted numbers, each counted number representing the number of the indicative pulse signals generated during a time from an occurrence of one the control pulse signal to an occurrence of next the control pulse signal. Then, whether or not the succession of counted numbers meets one of predetermined conditions is tested, and results of the testing are evaluated so as to examine operation of the control system.

4 Claims, 14 Drawing Sheets

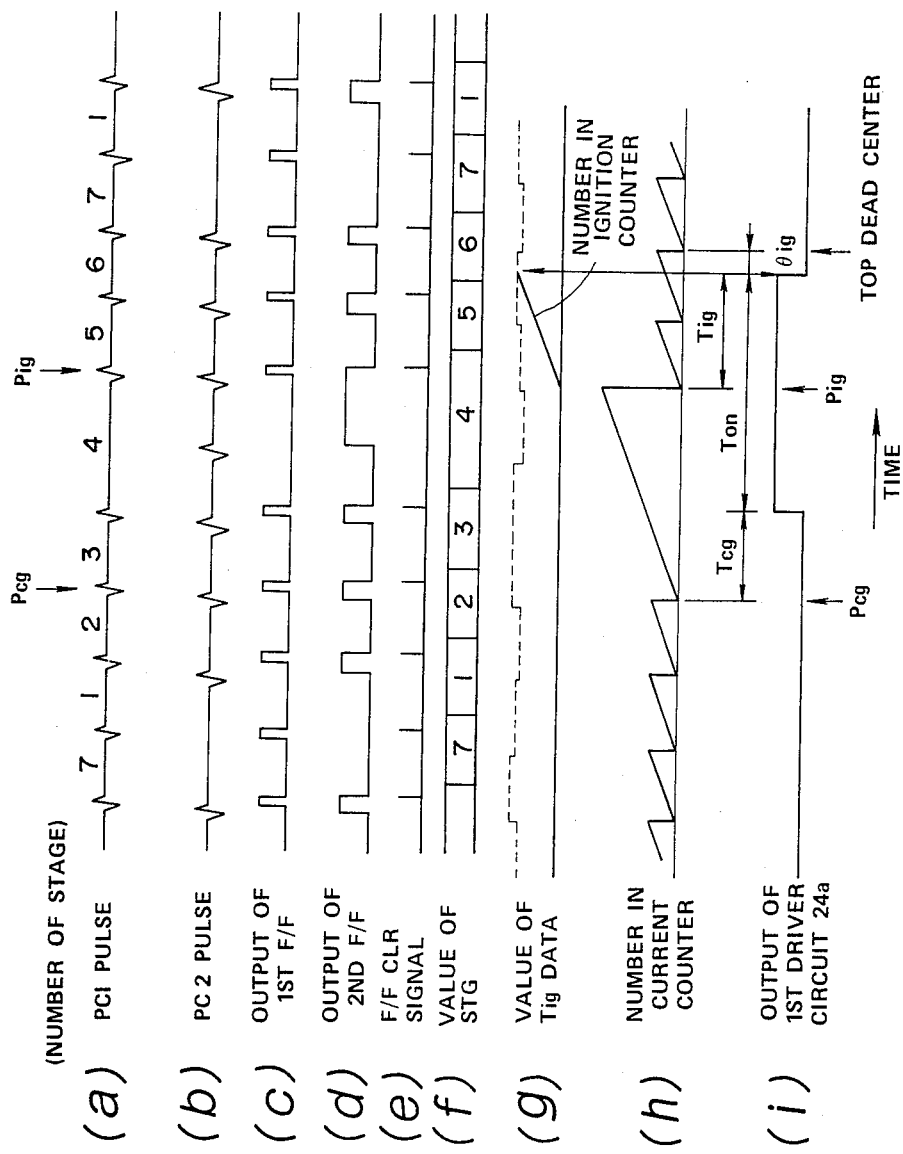

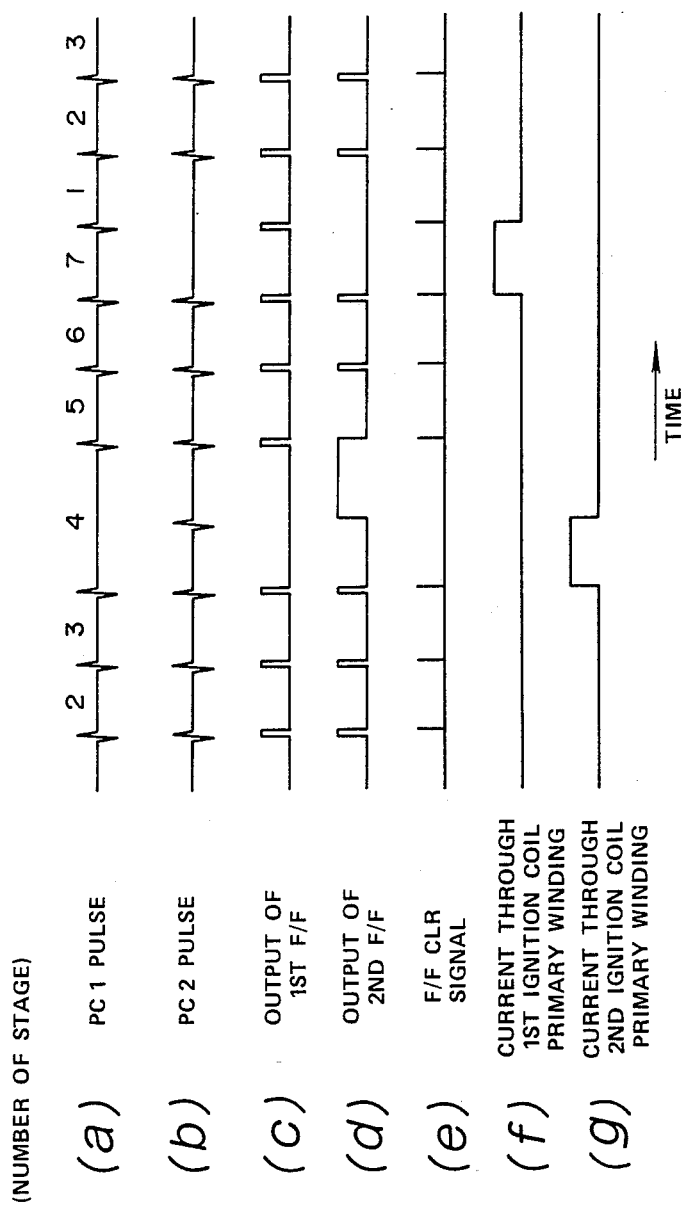

METHOD OF EXAMINING OPERATION OF ELECTRONIC CONTROL SYSTEM FOR INTERNAL COMBUSTION ENGINES

BACKGROUND OF THE INVENTION

The present invention relates to an electronic control system for controlling an internal combustion engine, and more particularly to a method of examining the operation of such an electronic control system.

Many automotive internal combustion engines are equipped with electronic engine control systems. Various different engine operation-related factors can be controlled by such an electronic control system. Major examples of such controllable factors include the ignition spark timing, the timing of fuel injection, and the amount of fuel to be injected. These controllable factors must be controlled according to the angular position of the crankshaft. To find the angular position of the crankshaft, a crankshaft sensor is required to determine the speed of rotation of the engine and the positions of the respective pistons in engine cylinders. More specifically, the crankshaft sensor operates to gain information on the phase of the engine crankshaft, which is the relative angular position of the crankshaft during one cycle of engine operation with respect to a reference crank angle position. This may be the angular position of the crankshaft when a certain piston is in the top dead center. The crankshaft phase information can be calculated from (1) information on the reference crank angle position which is obtained when the crankshaft reaches the reference angular position, and (2) information on the rotational speed of the crankshaft which is obtained by detecting the rotational speed of the crankshaft. One known means for producing such crankshaft phase information comprises a pulse signal generating mechanism including a toothed wheel of a magnetic material mounted on the engine crankshaft. An electromagnetic transducer or pickup is provided for generating an electric pulse in response to detection of each tooth of the toothed wheel as it passes by the electromagnetic pickup. One example of a reference angular position detector employing such a pulse signal generating mechanism is disclosed in Japanese Utility Model Publication No. 58(1983)-26339. The disclosed reference angular position detector includes a rotor of a magnetic material attached to the crankshaft of an engine, the rotor having teeth disposed on its outer circumferential surface at angular intervals of a unit rotational angle $\alpha°$ for generating rotational angle information. The rotor also has one tooth-free recess for producing information on a reference crank angle position. The angular position detector also includes a pair of first and second electromagnetic pickups positioned adjacent to the rotor and angularly spaced along the outer circumferential surface of the rotor by a distance corresponding to a multiple of the unit rotational angle $\alpha°$. As the engine rotates, the first and second electromagnetic pickups produce first and second pulse signals, respectively, which are subtracted one from the other to generate a differential output. The differential output is employed to detect when the second pulse signal from the second electromagnetic pickup is not generated at the tooth-free recess and only the first pulse signal from the first electromagnetic pickup is produced. The crank angle position at the time such a condition arises is detected as the reference crank angle position.

The electronic control system includes a sensor for obtaining information, a driver for driving an actuator, and an electronic control unit (hereinafter referred to as an "ECU") for processing a signal from the sensor to apply a command to the driver. The ECU comprises a computer in most cases. If the pulse signal generating mechanism which supplies the ECU with electronic pulses generated by the electromagnetic pickup is employed as a crankshaft sensor, the pulse signal generating mechanism is susceptible to operational error since it is placed in a relatively harsh environment. There are two main causes of such operational error. First, sparks generated by ignition plugs produce strong electromagnetic waves which induce noise in wires interconnecting the pulse signal generating mechanism and the ECU, and such noise and a normal pulse signal are applied together to the ECU, tending to cause the ECU to malfunction. Secondly, signal pulses induced by the electromagnetic pickup become weaker as the rotational speed of the engine and hence the rotational speed of the toothed wheel are lowered. When the engine speed is extremely low, the pulse signal is too weak to act properly on the ECU. At any rate, inasmuch as the ECU operates on wrong information, its operation becomes inaccurate.

SUMMARY OF THE INVENTION

It is an object of the present invention to effectively and sufficiently reduce the possibility for an electronic control system to be subjected to operational error due to the above described and other causes.

Another object of the present invention is to provide a method of detecting faults of an electronic control system by monitoring a signal issued from a pulse signal generating mechanism and producing a control signal by the electronic control system, thereby increasing the reliability of the electronic control system.

According to the present invention, there is provided a method of examining operation of an electronic control system for an internal combustion engine having a crankshaft. The control system typically has a mechanism for generating pulse signals indicative of angular position of the crankshaft and means for evaluating the indicative pulse signals so as to output pulse signals for controlling an engine operation-related factor. The mechanism generates each of the indicative pulse signals at a time when the crankshaft is at one of predetermined angular positions, the means outputting each control pulse signal when the crankshaft is at a desired angular position, the method comprising the steps of: counting continuously the indicative pulse signals so as to generate a succession of counted numbers, each counted number representing the number of the indicative pulse signals generated during a time from an occurrence of one control pulse signal to an occurrence of a next control pulse signal; testing whether or not the succession of counted numbers meets one of predetermined conditions; and evaluating results of the testing so as to examine operation of the control system.

The above and further objects, details and advantages of the present invention will become apparent from the following detailed description of preferred embodiments thereof, when read in conjunction with the accompanying drawings.

BRIEF DESCRIPTION OF THE DRAWINGS

FIG. 10 is a timing chart of signals generated in an electronic control unit 2 in the electronic ignition timing control device of FIG. 1;

FIG. 16 is a timing chart of signals generated in an electronic control unit 2' when fixed ignition control is executed.

DETAILED DESCRIPTION OF THE PREFERRED EMBODIMENTS

A method according to an embodiment of the present invention, as applied to an electronic ignition timing control device for an internal combustion engine, will hereinafter be described. However, the method of the invention is also applicable to other electronic control systems based on the following teaching.

Figure 1:
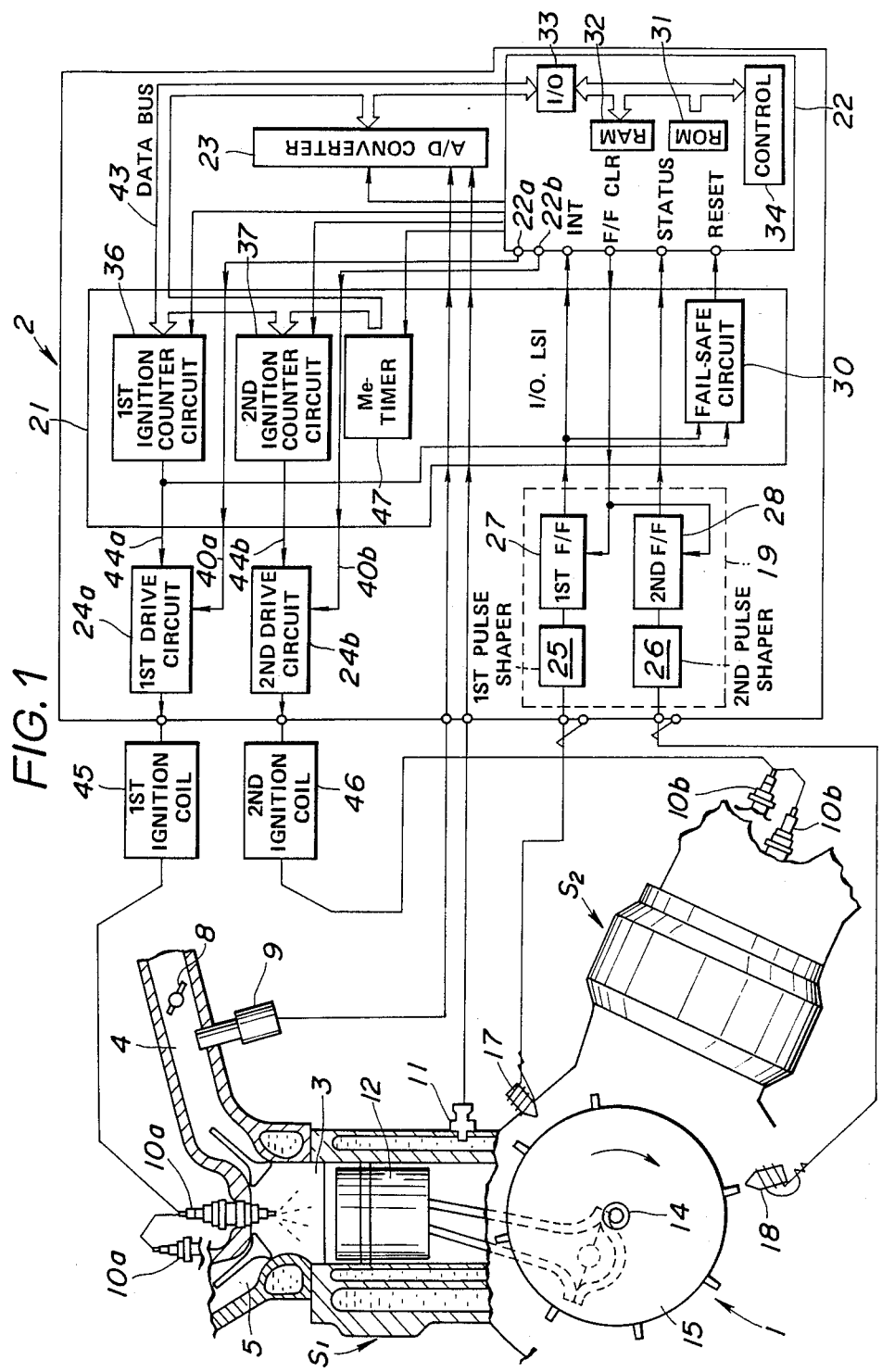
FIG. 1 is a block diagram of an electronic ignition timing control device for an internal combustion engine, which is used to carry out a method according to the present invention.

As shown in FIG. 1, the electronic ignition timing control device generally comprises a pulse signal generating mechanism 1 for generating a pulse signal in response to rotation of the crankshaft of the engine, sensors 9, 11 for detecting engine conditions and generating electric signals according to the detected engine conditions, first and second ignition coils 45, 46 for energizing ignition spark plugs of the engine to enable them to produce sparks, and an electronic control unit (hereinafter referred to as an "ECU") 2 for processing signals supplied from the sensors 9, 11 and the pulse signal generating mechanism 1 and controlling the ignition coils 45, 46 according to the processed signals.

The internal combustion engine controlled by the electronic ignition timing control device is a V-shaped 4-cylinder 4-stroke engine having two cylinder banks or arrays S1, S2 which are angularly spaced 128 degrees, each of the cylinder banks S1, S2 having two cylinders. The ignition timing control device can be used with various different engines simply by modifying a small portion of software for operating the ECU and changing the positions where the parts of the pulse signal generating mechanism are located, without altering the hardware of the ignition timing control device. Therefore, the ignition timing control device is of great industrial advantage particularly from the standpoint of mass production. Engine types to which the ignition timing control device is applicable include V-shaped 2- or 4-cylinder engines with cylinder banks angularly spaced 45 degrees, 60 degrees, 90 degrees, 135 degrees, etc., or in-line or flat opposed 4-cylinder engines. Software modifications required to adapt the ignition timing control device to these engine types will be described later on. One of the four cylinders is cross-sectionally shown in FIG. 1. Ignition spark plugs 10a, 10b are mounted on the cylinders. The ignition spark plugs 10a on the two cylinders in one cylinder bank S1 are electrically connected to each other and to the first ignition coil 45, and the ignition spark plugs 10b on the two cylinders in the other cylinder bank S2 are electrically connected to each other and to the second ignition coil 46. The two interconnected spark plugs can therefore produce sparks simultaneously. The interval between ignition timings in the two cylinders in the same cylinder bank is 360 degrees in terms of the rotational angle of the crankshaft. Therefore, when one of the spark plugs on the two cylinders in the same cylinder bank produces a timely spark, the other spark plug sparks in an exhaust stroke. According to this ignition system, some produced sparks are not used for igniting an air-fuel mixture, and a distributor normally employed in a multicylinder engine is dispensed with. Each ignition coil 45, 46 is of a known structure having a primary winding to which an electric current is supplied and a secondary winding connected to the ignition spark plug. A high voltage can be induced across the secondary winding by controlling the electric current supplied to the primary winding in the usual manner.

Each engine cylinder has a combustion chamber 3 which communicates with an intake pipe 4 having an intake valve and an exhaust pipe 5 having an exhaust valve. A throttle valve 8 is disposed in the intake pipe 4. A pressure sensor 9 is mounted on the intake pipe 4 downstream of the throttle valve 8 for detecting the pressure (intake pressure) in the intake pipe 4 to generate an electric signal (hereinafter referred to as a "pressure signal") dependent on the detected intake pressure, the pressure signal being applied to the ECU 2. The engine has a water jacket for cooling the engine cylinders with a coolant liquid. A coolant temperature sensor 11 including a thermistor is mounted on the water jacket. The coolant temperature sensor 11 generates an electric signal (hereinafter referred to as a "temperature signal") commensurate with the temperature of the coolant liquid in the water jacket and supplies the temperature signal to the ECU 2. The engine also has a crankshaft 14 to which a rotor 15 of the pulse signal generating mechanism 1 is secured.

Figure 2:
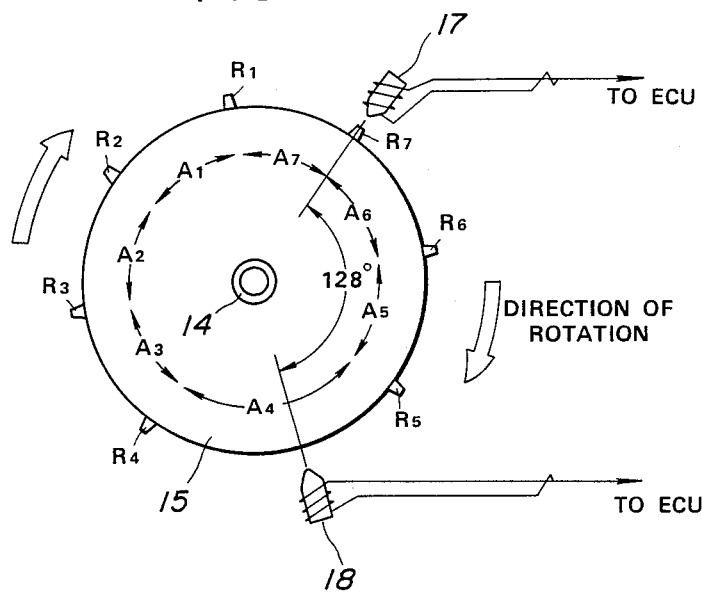
FIG. 2 is an enlarged view of a pulse signal generating mechanism in the electronic ignition timing control device shown in FIG. 1, the view showing the positional relationship between reactors and pulsers of the pulse signal generating mechanism.

As shown in FIG. 2, the rotor 15 is in the form of a disc with its center fixedly coupled to one end of the crankshaft 14. Seven reactors R1 through R7 of a magnetic material are mounted on the outer circumferential edge of the rotor 15 at seven out of eight angularly spaced positions which are spaced 45 degrees, the reactors R4, R5 being spaced 90 degrees from each other. The reactors R1 through R7 project radially outwardly from the outer circumferential edge of the rotor 15. Where the rotor 15 is made of a nonmagnetic material, the reactors R1 through R7 may be embedded in the rotor 15. The pulse signal generating mechanism 1 also includes first and second pulsers 17, 18 mounted on the engine body adjacent to the outer circumference of the rotor 15. Each of the pulsers 17, 18 is an electromagnetic pickup or transducer comprising a magnet and a coil wound around the magnet. The first and second pulsers 17, 18 are angularly spaced from each other around the rotor 15 by an angular interval dependent on the angular intervals between the top dead centers of the cylinders and the number of the cylinders of the engine controlled by the electronic ignition timing control device. In the illustrated embodiment, the top dead centers of the four cylinders are angularly spaced 128 degrees, 232 degrees, 128 degrees, and 232 degrees, and the first and second pulsers 17, 18 are spaced 128 degrees from each other. The top dead centers and the pulsers are angularly spaced at the same angular interval in order to carry out fixed ignition, which will be described later. Where the device is to be modified to meet a different mode of fixed ignition, fewer limitations are imposed on the angular interval between the pulsers. Such limitations imposed on the angular interval between the pulsers will be described later. When the engine is in operation, the reactors R1 through R7 successively move past the pulsers 17, 18 to induce pulsed voltages across the coils of the pulsers 17, 18.

For a better understanding of the present invention and to avoid confusion in carrying out the present invention, the seven reactors are numbered, and seven angular areas each defined between two adjacent reactors are also numbered. As shown in FIG. 2, six out of the seven angular or sectorial areas each have an angular extent of 45 degrees, and the remaining one has a wider angular extent of 90 degrees. The two reactors R6, R7 can be positioned opposite to the first pulser 17 when the second pulser 18 is positioned opposite to the wider angular area, and one R7 of the two reactors which follows the other reactor R6 in the direction of rotation of the rotor 15 is numbered 7. The reactor R7 will hereinafter be called a reference reactor since it will frequently be referred to in carrying out the method of the invention. The reactors R1 through R6 which successively reach the position opposite to the first pulser 17 as the rotor 15 rotates are numbered "1" through "6", respectively, and will be called first through sixth reactors. The angular areas A1 through A7 are numbered with the same numbers as those of the reactors R1 through R7 which precede them in the direction of rotation of the rotor 15, and will be called first through seven areas. The wider angular area is the fourth area A4 as shown in FIG. 2. The period during which the first pulser 17 remains opposite to the nth area will be referred to as an "nth stage". The fourth stage is substantially twice longer than the other stages.

Referring back to FIG. 1, the ECU 2 comprises an input circuit 19 for receiving and processing pulse signals from the first and second pulsers 17, 18, first and second drive circuits 24a, 24b for supplying electric currents to the first and second ignition coils 45, 46, respectively, a central processing unit (hereinafter referred to as a "CPU") 22 for performing various calculations and signal processing required for ignition timing control, an input/output large-scale integrated circuit (hereinafter referred to as an "I/O LSI") 21, and an analog-to-digital converter (hereinafter referred to as an A/D converter) 23. This I/O LSI has some functions as described later on, and each of such functions is relatively simple and well known in the art. For designing the LSI, individual circuits for performing the respective functions may be constructed as hardware, or the LSI may be designed as a computer with the functions performed by software. Alternatively, the LSI may be replaced with other electronic circuits which can perform the required functions. Whether the LSI or other electronic circuits are to be employed depends on the scale of production of the device. The I/O LSI 21 is capable of processing the signals from the input circuit 19 and the sensors 9, 11 and applies the processed signals to the CPU 22. Those processed signals which are in the analog form are converted by the A/D converter 23 into digital signals before being delivered to the CPU 22. The I/O LSI 21 includes first and second ignition counter circuits 36, 37 for processing ignition signals issued from the CPU 22 and applying the processed signals to the first and second drive circuits 24a, 24b, a timer (hereinafter referred to as an "Me timer") 47 for measuring the interval between pulses generated by the first pulser 17, and a fail-safe circuit 30 for supervising the generation of the pulses generated by the first pulser 17 and the timing of ignition caused by the first ignition coil 45 to detect ignition control malfunctioning and for resetting the CPU 22 when such ignition control malfunctioning is detected.

The input circuit 19 comprises first and second pulse shapers 25, 26 connected respectively to the first and second pulsers 17, 18 for shaping the waveforms of the pulse signals generated by the first and second pulse shapers 17, 18 (the pulse signal generated by the first pulser will be referred to as a "PC1 pulse") and the pulse signal generated by the second pulser will be referred to as a "PC2 pulse"), and first and second flip-flops 27, 28 (indicated as F/F in FIG. 1) connected to the pulse shapers 25, 26, respectively, for latching the output signals from the pulse shapers 25, 26.

Each of the flip-flops 27, 28 has a set terminal (input terminal), a reset terminal, and a Q output terminal. Once a high-level signal such as a pulse signal is applied to the set terminal, the Q output terminal continues to issue a high-level signal until a high-level signal is applied to the reset terminal. Once a high-level signal is applied to the reset terminal, the Q output terminal continues to issue a high-level signal until a high-level signal is applied to the set terminal. Therefore, each of the first and second flip-flops 27, 28 is a so-called SR flip-flop. The set terminal of the first flip-flop 27 is connected to the output terminal of the first pulse shaper 25, and the Q output terminal thereof is connected to the I/O LSI 21. The output signal from the first flip-flop 27 is applied via the I/O LSI 21 to an INT terminal (interrupt terminal) of the CPU 22. The set terminal of the second flip-flop 28 is connected to the output terminal of the second pulse shaper 26, and the Q output terminal thereof is connected to the I/O LSI 21. The output signal from the second flip-flop 28 is applied via the I/O LSI 21 to a STATUS terminal (interrupt terminal) of the CPU 22. The reset terminals of the first and second flip-flops 27, 28 are interconnected and coupled to the I/O LSI 21. When a clear signal from the CPU 22 is applied through the I/O LSI 21 to these reset terminals, the first and second flip-flops 27, 28 are reset.

When the PC1 pulse or the PC2 pulse is generated while the flip-flops are being reset, the output signal from the corresponding flip-flop goes from a low level to a high level. As this change in the output level is transmitted to the CPU 22, the CPU 22 can simultaneously detect the generation of the pulse. The detection by the CPU 22 of the change from the low level to the high level of the output signals from the first and second flip-flops 7, 28 will hereinafter be expressed as application of the PC2 pulse to the CPU 22 and application of the PC2 pulse to the CPU 22.

The CPU 22 may be of any conventional arrangement comprising a control processor unit 34 including registers and an accumulator, a read-only memory (hereinafter referred to as a "ROM") 31, a random-access memory (hereinafter referred to as a "RAM") 32, and an input/output buffer 33.

There are two important operations among various operations performed for ignition timing control. One of such two important operations is to generate current supply starting signals to be supplied to the drive circuits for starting current supply to the ignition coils. The other important operation is to generate current supply stopping signals (ignition signals) to be supplied to the drive circuits for stopping current supply to the ignition coils. The ignition coils enable the spark plugs to produce sparks when the current supply stopping signals are applied to the drive circuits. The current supply starting signals are generated by the CPU 22 and applied through the I/O LSI 21 to the drive circuits. The current supply stopping signals are generated by the I/O LSI 21 based on ignition timing data delivered from the CPU 22 to the I/O LSI 21 and are fed to the drive circuits.

In order to generate the current supply starting signals, an internal counter (hereinafter referred to as a "current counter") for counting clock pulses generated by the CPU 22, a pair of registers (hereinafter referred to as "current registers") for storing current supply starting timing data calculated by the control processor unit 34, and a pair of comparators for comparing the count of the current counter and the stored values of the current registers to determine whether they are the same or not, are implemented by a program in the RAM 32. Therefore, the functions of the current counter, the current registers, and the comparators are actually performed by the control processor unit 34. The CPU 22 has first and second output ports 22a, 22b. When one of the comparators detects coincidence between the compared values, the output signal from the first output port 22a changes from a low level to a high level. When the other comparator detects such coincidence, the output signal from the second output port 22b changes from a low level to a high level. Stated otherwise, these first and second output ports 22a, 22b issue output signals when the comparators detect coincidence between the compared values. (The high and low levels of the signals may also be referred to as "1" and "0" levels, respectively, and the transition of the output signals from the low level to the high level may be expressed as delivery of the signal or the "1" level.) These output signals from the output ports 22a, 22b constitute the current supply starting signals. The output signal from the first output port 22a is fed via the I/O LSI 21 to the first drive circuit 24a, and the output signal from the second output port 22b is fed via the I/O LSI 21 to the second drive circuit 24b.

The I/O LSI 21 has first and second ignition counter circuits 36, 37 for generating the current supply stopping signals (ignition signals). The first and second ignition counter circuits 36, 37 are supplied with 16-bit ignition timing data (curresnt supply stopping timing data) over a data bus 43 from the CPU 22. The first ignition counter circuit 36 generates the current supply stopping signal to be applied to the first drive circuit 24a, and the second ignition counter circuit 36 generates the current supply stopping signal to be applied to the second drive circuit 24b.

Figure 3:
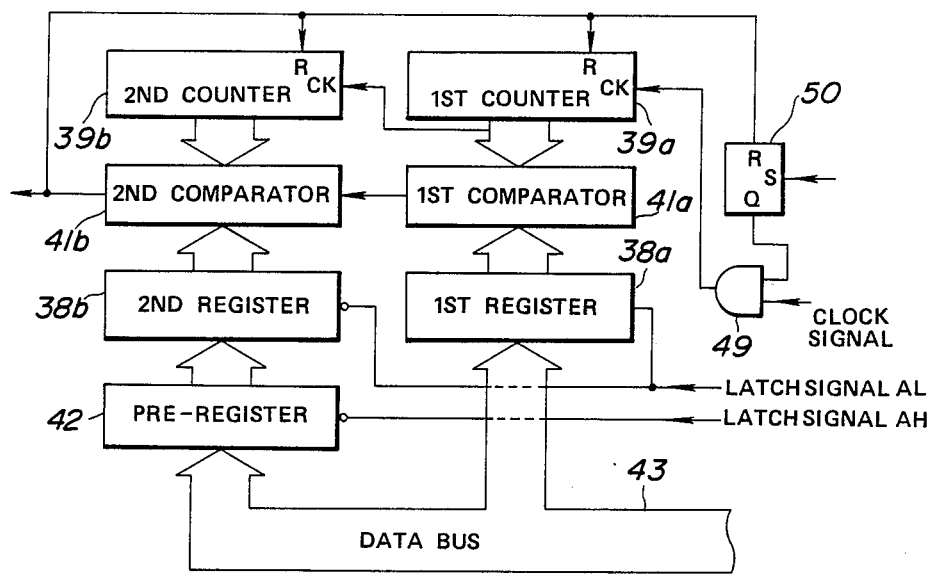
FIG. 3 is a block diagram of an ignition counter circuit in the electronic ignition control device of FIG. 1.

Since the first and second ignition counter circuits 36, 37 are identical in construction, only the first ignition counter circuit 36 will hereinafter be described. As shown in FIG. 3, the first ignition counter circuit 36 has first and second registers 38a, 38b for storing lower-order 8 bits and higher-order 8 bits of the 16-bit ignition timing data, first and second counters 39a, 39b for counting the pulses of a clock pulse signal generated in the I/O LSI 21 at a constant periodic rate, a first comparator 41a for comparing the data stored in the first register 38a and the count of the first counter 39a, a second comparator 41b for comparing the data stored in the second register 38b and the count of the second counter 39b, and a pre-register 42 connected to the second register 38b by a bus line for storing the higher-order 8 bits of the ignition timing data. The first register 38a and the pre-register 42 are connected by the data bus 43 to the CPU 22. The first and second counters 39a, 39b comprise 8-bit up counters, respectively. The first counter 39a has a clock terminal CK connected to the output terminal of an AND gate 49. The AND gate 49 has one input terminal coupled to the Q output terminal of an SR flip-flop 50. The other input terminal of the AND gate 49 is supplied with the clock pulse signal from the I/O LSI 21. The first counter 39a has a MSB output terminal connected to the clock terminal CK of the second counter 39b. The second comparator 41b has an output terminal connected to the first drive circuit 24a, the reset terminals of the first and second counters 39a, 39b and the SR flip-flop 50. The SR flip-flop 50 has a set terminal S supplied with a starting signal pulse from the CPU 22. Operation of the ignition counter circuit thus constructed will be described later on.

A flowchart of operations to be executed by the CPU 22 and operation of the electronic ignition timing control device will be described below. The program to be executed by the CPU 22 includes a main routine and an interrupt routine. The main routine comprises a step of initialization effected when the engine is started and of detecting the reference crank angle position, and a loop entered by the processing after the above steps are ended and repeatedly performed by the processing during operation of the engine. After the processing has initiated the loop, control can be transferred from the main routine to the interrupt routine which has been inhibited. More specifically, each time a PC1 pulse is generated by the first pulser 17, a signal is applied from the first flip-flop 27 to the INT terminal of the CPU 22, the processing enters the interrupt routine. After the interrupt routine has been brought to an end, the processing returns to the loop in the main routine.

The main routine of the program will be described first briefly and then in detail. When the ignition key is turned on to start engine cranking, the processing starts to flow from a step 100 shown in FIG. 4 in which the CPU 22 is initialized and the reference crank angle position is detected. Then, the processing goes to a step 200 which calculates a time Te required for the crankshaft to make latest one revolution, stores the calculated time Te, determines which one of predetermined engine speed ranges the rotational speed Ne of the engine falls in, and sets flags according to the determined speed range. Then, a step 300 calculates and stores an angle of advance $\theta$ig suitable for engine operating conditions. The processing thereafter goes to a step 400 which calculates and stores a continuous current supply time Ton during which an electric current is continuously supplied to the ignition coil. Finally, the processing proceeds to a step 500 which calculates current supply starting timing data Tcg and ignition timing data Tig based on the angle of advance $\theta$ig and the continuous current supply time Ton. The processing returns from the step 500 to the step 200, thus completing the loop.

Figure 4:
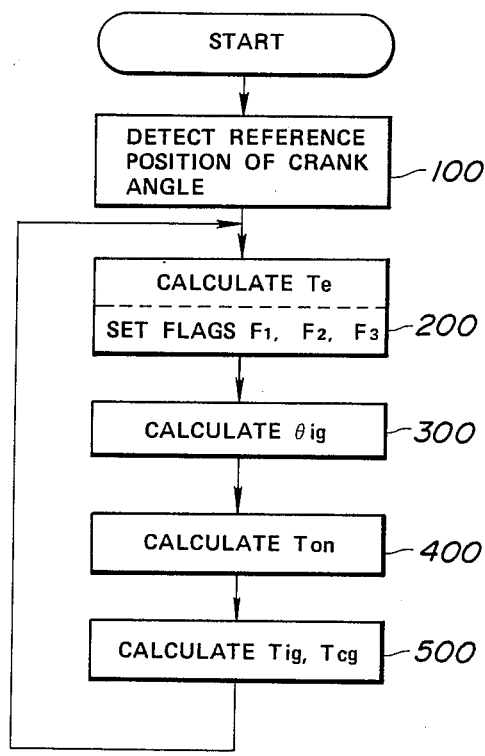
FIG. 4 is a flowchart of the main routine in a program for ignition timing control which is executed by a central processing unit (CPU) in the electronic ignition timing control device of FIG. 1.
Figure 5:
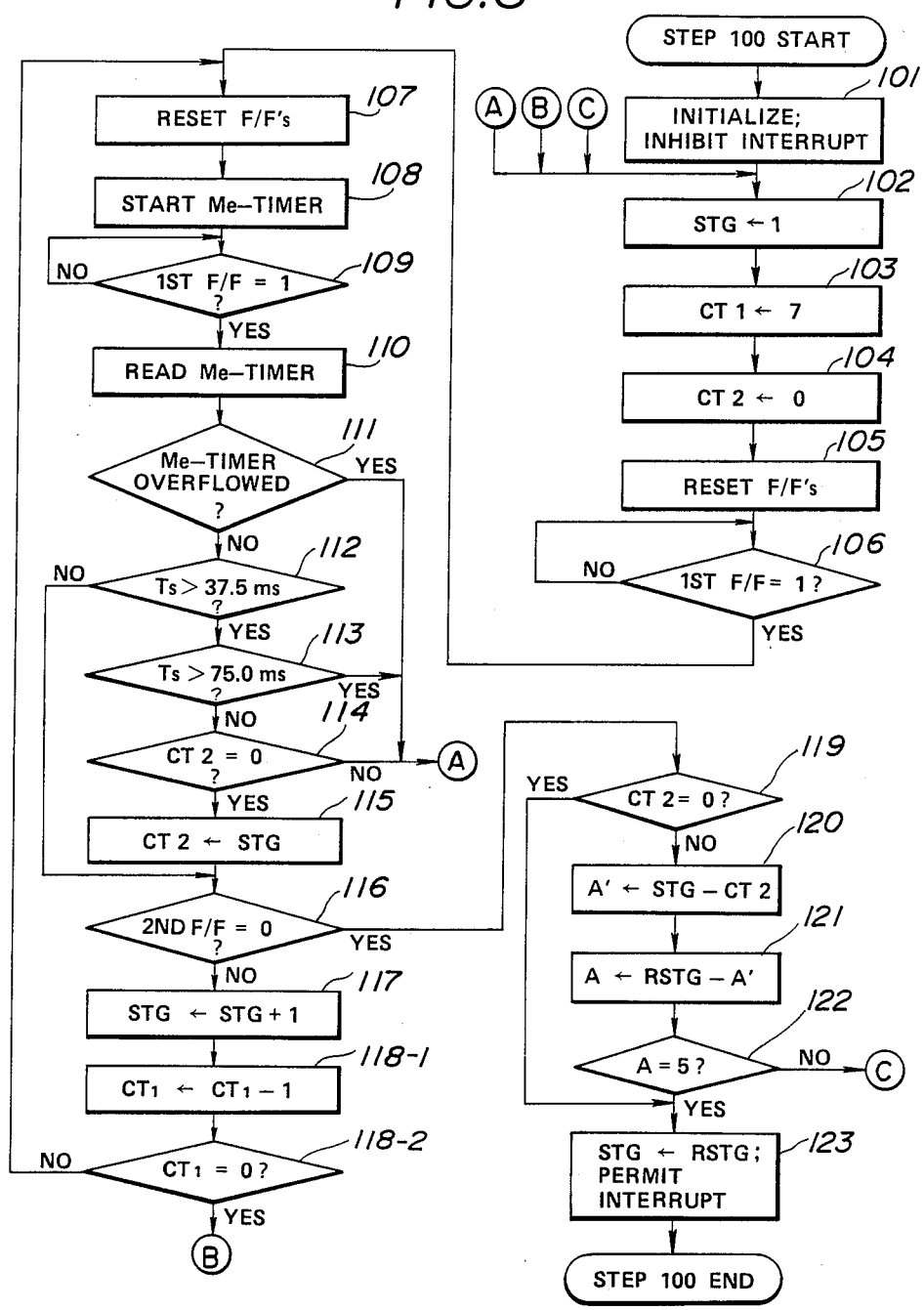
FIG. 5 is a flowchart of a sequence of operations for detecting a reference crank angle position at the time of starting the internal combustion engine, the operation sequence being executed in a step 100 of the flowchart shown in FIG. 4.

FIG. 5 shows in detail an instruction sequence for the initialization and detection of the reference crank angle position in the step 100 of FIG. 4, the instruction sequence being divided into steps 101 through 124. Immediately after the ignition switch is turned on or when the CPU 22 is reset at the time an output timing signal failure or a CPU runaway is detected, a step 101 is executed to initialize the CPU 22. In this initializing step 101, the area of the RAM 32 is cleared to zero and the I/O port 33 is initialized, while at the same time an interrupt is inhibited even if a signal is applied to the INT terminal of the CPU 22. The processing then goes to a step 102 from which a sequence of steps for detecting the reference crank angle position are started.

The detection of the reference crank angle position in the disclosed ignition timing control device will hereinafter be described. The crankshaft phase information is derived from information on the reference crank angle position and information on the rotational speed of the crankshaft. More specifically, the crankshaft phase is calculated by adding, to the reference crank angle position, an angle of rotation obtained by multiplying the time elapsed after the crankshaft has passed the reference angle position by the rotational speed of the crankshaft. In the disclosed ignition timing control device, an angle of rotation obtained after the crankshaft has passed a single reference angle position is not utilized, but an angle of rotation obtained after suitable ones of the reactors have passed the first pulser. When one reactor passes the first pulser 17, a PC1 pulse is generated thereby and applied via the first flip-flop 27 to the INT terminal of the CPU 22, which can now detect the passage of the reactor past the first pulser 17. If the CPU 22 is supplied at this time with information indicative of the reactor involved in generating the PC1 pulse, then CPU 22 can attain information on the reference crank angle position.

According to the method of the present invention, a variable STG is established in the CPU 22 by the program. The value of this variable STG is updated after the CPU 22 has received one PC1 pulse and until it receives a next PC1 pulse. The CPU obtains the above information by referring to the value of the variable STG. Specifically, the variable STG can take the value of one of the seven integers "1" through "7" at a time. As long as the value of the variable STG is smaller than "7", it is incremented by "1". When the value of the variable STG is "7", it is updated to "1". The value of the variable STG is also initialized when the engine is started, and is updated to "7" after the CPU 22 has received a PC1 pulse produced by the reference reactor R7 and until it receives a PC1 pulse produced by the first reactor R1. Where n=1 through 6, for example, the value of the variable STG is updated to "n" after a PC1 pulse produced by the nth reactor has been supplied to the CPU 22 and until a PC1 pulse produced by the following (n+1)th reactor is applied to the CPU 22.

During an interval of time after a PC1 pulse has been generated and until the value of the variable STG is updated, the value of the variable STG is equal to the number of the angular area on the rotor 15 which precedes the angular area which the first pulser 17 faces. After the value of the variable STG has been updated and before a next PC1 pulse is generated, the value of the variable STG is equal to the number of the angular area on the rotor which the first pulser 17 faces.

In the disclosed method, therefore, the step of initializing the variable STG is contained in the detection of the reference crank angle position.

The flowchart of FIG. 5 will be described briefly below prior to description in detail thereof for an easier understanding of the process of detecting the reference crank angle position. An important object of the flowchart shown in FIG. 5 is to set the value of the variable STG to "7" when a PC1 pulse produced by the reference reactor R7 is applied to the CPU 22. The setting of the variable STG is effected by a final step 123 in the flowchart of FIG. 5. The steps prior to the final step 123 serve to identify the PC1 pulse produced by the reference reactor R7. As is clear from FIG. 2, a PC2 pulse is generated at all times immediately before a PC1 pulse is produced by any of the reactors except the reference reactor R7. As described later, the first and second flip-flops 27, 28 are reset in each stage (see the timing chart of FIG. 10). Therefore, insofar as the pulse signal generating mechanism 1 functions properly, the output signal from the second flip-flop 28 which latches the PC2 pulse is low in level immediately after the PC1 pulse is produced by the reference reactor R7, and the output signal from the second flip-flop 28 is high in level immediately after a PC1 pulse is generated by any other reactors. The output signal from the second flip-flop 28 is checked in a step 116. If this output signal is low, then the processing goes from the step 116 to a step 120. If not, the processing goes through a loop including the step 116 to check the output signal of the second flip-flop 28 in the step 116 when a next PC1 pulse is received. Such a loop goes from a step 107 through the step 116 and a step 119 back to the step 107, and will be referred to as a "detection loop".

The flowchart of FIG. 5 also contains a step for preventing erroneous detection of the reference crank angle position. If the rotational speed of the engine is extremely low, for example, and hence the amplitude of the pulse signals induced across the pulsers is so small that the pulse signals will be eliminated by being processed by the pulse shapers, then the CPU 22 will tend to have wrong reference crank angle position information unless suitable countermeasures are taken. Such a tendency of the CPU 22 is large particularly when the engine is started since the rotational speed of the engine is low. To remove such a problem, according to the method of the invention, two processes are employed: (1) The detection of the reference crank angle position is interrupted and started again when the rotational speed of the engine is 200 rpm or below; and (2) The output signal from the second flip-flop 28 is checked each time the PC1 pulse generated by the first pulser is applied to the CPU, and the detection of the reference crank angle position is interrupted and restarted when no low-level output signal from the second flip-flop 28 is detected until 7 PC1 pulses are applied to CPU.

The operation sequence for detecting the reference crank angle position will now be described in greater detail with reference to FIG. 5. The detection of the reference crank angle position is started from a step 102 which temporarily sets the variable STG to "1". Until the detection of the reference crank angle position is completed, the variable STG is referred to only for detecting the number of stages which have passed. A next step 103 sets a variable CT1 to "7" which is the number of the reactors on the rotor 15. Then, a variable CT2 is set to "0" in a step 104. Clear signals are issued from the CPU 22 to the first and second flip-flops 27, 28 to reset them in a step 105. A next step 106 checks the output signal from the first flip-flop 27. If the output signal of the first flip-flop 27 is low, then the step 106 is repeated. If the output signal of the first flip-flop 27 is high, the processing enters the detection loop as described above, i.e., goes to the stgep 107. Stated otherwise, the step 106 waits until a PC1 pulse is applied to the INT terminal of the CPU 22. The step 107 issues clear signals to reset the flip-flops. The Me timer is started in a next step 108. Since the PC1 pulse is waited for in the step 106, the Me timer can be started in the step 108 immediately after the PC1 pulse has been generated.

For an easier understanding of the process of detecting and confirming the reference crank angle position, the manner in which the variable STG, and the variables CT1, CT2 vary will be described with reference to the following table 1:

TABLE 1

| Number of reactors passing by 1st 1st pulser | — | 3 | 4 | 5 | 6 | 7 | 1 | 2 | 3 | 4 |
|---|---|---|---|---|---|---|---|---|---|---|
| Number of stages | — | 2 | 3 | 4 | 5 | 6 | 7 | 1 | 2 | 3 | 4 |
| Value of STG | — | — | 1 | 2 | 3 | 4 | 7 | 1 | 2 | 3 | 4 |
| Value of CT1 | — | — | 7 | 6 | 5 | 4 | 3 | 2 | 1 | 0 | 0 |
| Value of CT2 | — | — | 0 | 2 | 2 | 2 | 2 | 2 | 2 | 2 | 2 |
| Output signal of 2nd F/F referred to in step 116 | — | 1 | 1 | 1 | 1 | 0 | 1 | 1 | 1 | 1 |

↑
S

The table 1 indicates the values obtained when the engine is started at the time the pulser 17 is positioned opposite to the second area A2 on the rotor 15, and shows the manner in which the variables STG, CT1, CT2 vary when the actual engine speed is 200 rpm or higher.

After the Me timer 47 has been started in the step 108, a next PC1 pulse is awaited in a step 109. When the next PC1 pulse is applied, the value Ts measured by the Me timer 47 is read in a step 110. Then, a step 111 checks if the Me timer 47 is subjected to an overflow. The Me timer 47 is subjected to an overflow when the rotational speed Ne of the engine is extremely low such as 100 rpm or less. If there is an overflow in the Me timer 47, then the processing returns to the step 102 via a connector A. Thus, the detection of the reference crank angle position is interrupted and restarted. If there is no overflow in the Me timer 47, then the measured value of the Me timer 47 correctly represents the length of time Ts of the latest completed stage, and the processing goes to a step 112. The step 112, following steps 113 through 115, and steps 20 through 123 serve to ascertain whether the rotational speed Ne of the engine is in excess of 200 rpm that is the lower limit speed at which reliable operation of the pulse signal generating mechanism 1 can be expected. The operations executed in these steps will be described with reference to the following table 2:

TABLE 2

| Length of stage Ts (ms) | Engine speed Ne (rpm) | |
|---|---|---|
| | 4th stage | Other stages |
| Ts ≦ 37.5 | 400 ≦ Ne | 200 ≦ Ne |
| 35.5 < Ts ≦ 75.0 | 200 ≦ Ne < 400 | 100 ≦ Ne < 200 |
| 75.0 < Ts | Ne < 200 | Ne < 100 |

The table 2 indicates which range the rotational speed Ne of the engine is in when the length of time ts of the stage as measured by the Me timer belongs to one of the three ranges in the leftmost column. The engine speed ranges in the central column are given when the fourth stage is measured, the fourth stage being concerned with the fourth area Ar having an angular extent (90 degrees) twice that of the other areas. The engine speed ranges in the righthand column are given when the other stages than the fourth stage are measured. It should be noted that when the engine speed Ne is 200 rpm, the length of the fourth stage is 75.0 ms (milliseconds), and the length of the other stages is 37.5 ms. The step 112 ascertains whether the value of Ts is in excess of 37.5 ms or not. If not, then the processing jumps to the step 116. If Ts is not in excess of 37.5 ms, the engine speed Ne is of necessity 200 rpm or higher irrespectively of the stage measured as indicated by the first row of the table 2. If T is not in excess of 37.5 ms in the step 112, then the processing goes to a step 113 which ascertains whether the value of Ts is in excess of 75 ms or not. If yes, then the processing goes back to the step 102 via the connector A. At this time, the engine speed Ne is below 200 rpm irrespectively of the measured stage as indicated by the third row of the table 2. In such a low engine speed range, pulse signals may not be generated properly by the first and second pulsers 17, 18. If no in the step 113, the processing proceeds to a step 114. At this time, the value of Ts is in the range of 75 ms > Ts > 37.5 ms. As indicated by the second row of the table 2, the engine speed Ne is lower than 200 rpm when the stage measured by the Me timer is other than the fourth stage, and the engine speed Ne is between 200 rpm and 400 rpm when the fourth stage is measured. The step 114 ascertains whether the value of the variable CT2 is "0" or not. If not "0", then the processing returns via the connector A to the step 102 to restart the detection of the reference crank angle position. If "0", then the processing goes to a step 115 in which the variable CT2 is set to the value of the variable STG. The step 115 is followed by the step 116 which checks the output signal of the second flip-flop 28. If the output signal of the second flip-flop 28 is low in level, then the processing goes to the step 119, and if high in level, then the processing goes to a step 117. The variable STG is incremented by 1 in the step 117, and then the variable CT1 is decremented by 1 in a step 118-1, followed by a step 118-2 which ascertains whether the variable CT1 is "0" or not. If CT1 is "0", then the processing returns to the step 102 via a connector B to restart the detection of the reference crank angle position. If Ct1 is not "0", then the processing returns to the step 107 to repeat the detection loop. As long as the processing remains in this detection loop, the detection loop is executed once each time one PC1 pulse is applied to the CPU 22. If the engine speed Ne is 200 rpm or higher and the pulse signal generating mechanism 1 is properly functioning, the processing goes from the step 116 to the step 119, leaving the detection loop. The processing may leave the detection loop before one cycle of execution of the entire detection loop is completed. Normally, however, the processing leaves the detection loop after the detection loop has been executed repeatedly several times. The detection loop is not executed repeatedly more than 7 times because the consecutive 7 PC1 pulses always include a PC1 pulse produced by the reference reactor R7, and immediately after the PC1 pulse is generated by the reference reactor R7, the output signal from the second flip-flop 28 as checked by the step 116 is low in level, so that the processing can leave the detection loop (see the timing chart of FIG. 10).

Therefore, if all of the results of the successive 7 checks executed by the step 116 indicate that the output signal from the second flip-flop 28 is high in level while the detection loop is repeated 7 times, then the pulse signal generating mechanism 1 does not function properly. The steps 118-1 and 118-2 serve to prevent the detection loop from being executed repeatedly in more than successive 7 cycles when the pulse signal generating mechanism 1 malfunctions.

If the engine speed Ne is 200 rpm or higher and the pulse signal generating mechanism 1 is properly functioning, then it is only when the fourth stage is measured that there is a possibility for the result of the check of the step 112 to indicate that the value of Ts exceeds 37.5 ms while the detection loop is being repeated 7 times. Therefore, when such result is produced twice in the successive execution of the detection loop, it is possible for the pulse signal generating mechanism 1 to malfunction or for the engine speed Ne to be below 200 rpm. When this happens, the steps 114 and 115 interrupt and restart the detection of the reference crank angle position. Specifically, if the value of Ts is in excess of 5.0 ms in the step 114, the variable CT2 is set to a value other than "0" in the step 115. Therefore, when that happens twice in the successive detection loop execution, the processing returns from the step 114 to the step 102 to restart the detection of the reference crank angle position.

As described above, if the engine speed Ne is 200 rpm or higher and pulse signals are properly delivered from the pulse signal generating mechanism 1 to the CPU 22, the processing can leave the detection loop from the step 116 to the step 119. However, even if pulse singals are not properly delivered from the pulse signal generating mechanism 1, it may be possible for the processing to leave the detection loop from the step 116 to the step 119. The steps 119 through 122 are effective in additionally checking such a possibility. The step 119 ascertains whether the value of the variable CT2 remains "0" to which it has been set in the step 104. If yes, then the variable CT2 is set to the number "7" of the reference stage in the step 123. The variable CT2 is found to be "0" in the step 119 when the processing proceeds to the step 119 by bypassing the step 115. Therefore, the length Ts of the stage or the lengths Ts of any stages that have been measured have been 37.5 ms or shorter, and hence the engine speed Ne has certainly been 200 rpm or higher.

If not in the step 119, the processing goes to a step 120. The variable CT2 is found not to be "0" in the step 119 when the processing proceeds to the step 120 via the step 115. Therefore, if the stage measured for its length by the step 110 in the detection loop in the cycle in which the processing proceeds to the step 115 has been the fourth stage, then the engine speed Ne has been 200 rpm or higher. If not, it is certain that the engine speed Ne has not exceeded 200 rpm. Whether the stage measured in the step 110 has actually been the fourth stage is determined by following steps 120, 121, and 122 in the following manner:

As described above, after the value of the variable STG has been temporarily set to "1" in the step 102, it is incremented by 1 in the step 117 each time the detection loop is executed once, i.e., one stage is passed. In the step 115, the variable CT2 is set to the value of the variable STG at the time the processing goes through the step 115. Stated otherwise, the variable CT2 is set to the value of the variable STG after a stage (hereinafter referred to as a "stage Sx") with its length Ts between 37.5 ms and 75.0 ms has been completed and before the value of the variable STG is incremented in the step 117 in the detection loop executed in the following stage. Accordingly, the difference A' derived by subtracting the value of the variable CT2 from the value of the variable STG at the time the processing has reached the step 120 is representative of how many stages are there between a stage in which the length of the stage Sx is measured by reading the Me timer (i.e., the stage following the stage Sx) and the 7th stage (in which the processing can proceed from the step 116 to the step 119 and which may be referred to as a "reference stage"). The step 120 calculates and stores the difference A'. A next step 121 calculates and stores the difference A by subtracting the value of A' from the number (here "7") of the reference stage. Through the above calculations, the value A is equalized to the actual number of the stage following the stage Sx, i.e., the stage in wihch the length of the stage Sx has been measured.

Then, a step 122 ascertains whether the value of A thus calculated is "5" (i.e., the number of the stage following the 4th stage). If yes, then the processing goes to the step 123 in which the variable STG is set to "7" which is the number of the reference stage. If no in the step 122, then the processing goes via a connector C to the step 102 to restart the detection of the reference crank angle position. It should be noted that if the value of A is "5", the stage Sx with its length Ts between 37.5 ms and 5.0 ms has been the 4th stage and hence the engine speed has certainly been in excess of 200 rpm.

The above checking process will be described below with reference to the example given in the table 1 above. The column of the table 1 indicated by the arrow S represents the stage for which the steps 120 through 123 are executed. First, "STG−CT2=A'" is found in the step 120. STG is a value set in a stage right before the stage in which the reference position is found, and is 4 according to the numerical example. CT2 is a value of the second variable CT2 set in the step 115, and is 2 according to the numerical example. By putting these numerals in the above equation, 4−2=2, and hence A'=2. Then, A' is subtracted from the reference stage number RSTG to find A in the step 121. Since the reference stage number RSTG is "7", 7−2=5, and hence A=5. The step 122 ascertains whether the value of A is "5" or not. As the value of A is "5" according to the calculation in the step 121, the answer to the decision step 122 is yes. In the next step 123, the variable STG is set to "7" which is the number of the reference stage, followed by permission of an interrupt. The engine cranking which started when the ignition switch was turned on has continued until the processing proceeds up to the step 123, which additionally serves to stop such engine cranking. In the example of the table 1, the variable CT1 is decremented to "4" when the processing has reached the step 123. Thereafter, the variable CT1 is decremented by "1" in each stage until it becomes "0", not in the step 118-1, but in a step in a fixed ignition control subroutine shown in FIG. 14 (described later). No ignition occurs until the variable CT1 becomes "0". Accordingly, no ignition is brought about before the crankshaft completes a first revolution, and hence it is ensured that the engine will start operating smoothly.

Figure 6:
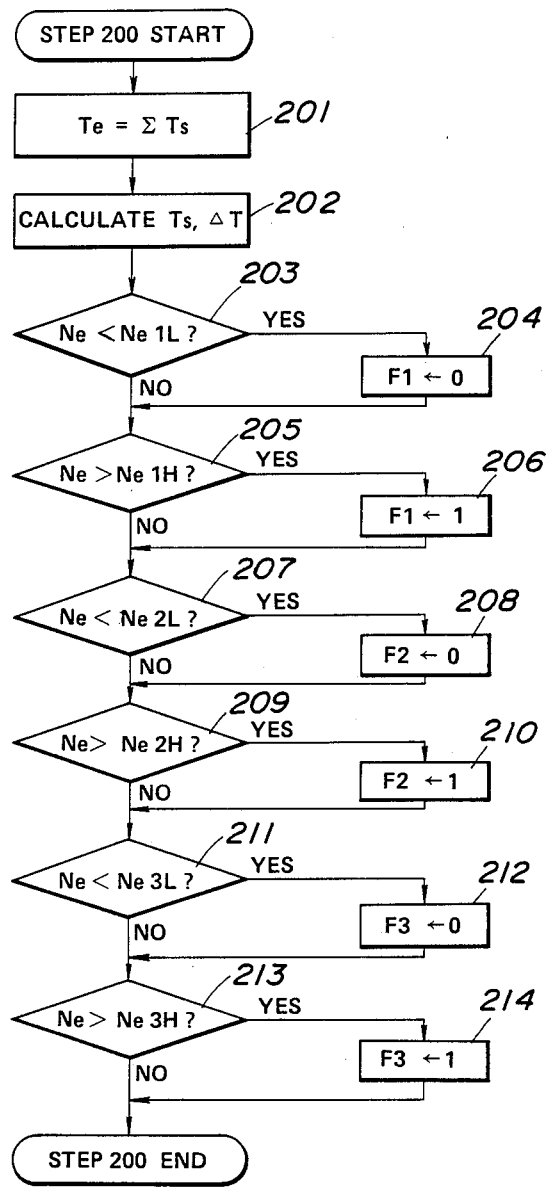
FIG. 6 is a flowchart of a sequence of operations executed in a step 200 of the flowchart shown in FIG. 4.

After the detection of the reference crank angle position has been completed, the processing enters the main routine loop by going to the step 200. If a PC1 pulse from the first pulser 17 is subsequently applied through the first flip-flop 27 to the CPU 22, the processing enters the interrupt routine. The step 200 is illustrated in greater detail in the flowchart of FIG. 6. In the flowchart of FIG. 6, the processing starts from a step 201 which calculates and stores a time Te required for the crankshaft to make latest one revolution by adding stored 7 stage lengths Ts, i.e., latest measured 7 stage lengths Ts. Each of the stage lengths Ts is measured and stored in either the step 110 while the reference crank angle position is being detected or the interrupt routine after the reference crank angle position has been detected. The RAM 32 of the CPU 22 has 7 addresses for storing the measured stage lengths Ts. The 7 Ts values are stored in an endless mode in which the earliest value of Ts which has been stored is rewritten by the newest value of Ts which has been measured.

Then, the processing proceeds to a step 202 which calculates and stores an average time $\overline{Ts}$ required for the crankshaft to rotate through 45 degrees (corresponding to each of the areas other than the 4th area A4, and an average time $\Delta T$ required for the crankshaft to make one revolution according to the following equations:

$$\overline{Ts}=Te/8 \qquad \ldots (1)$$

$$\Delta T=\overline{Ts}/45 \qquad \ldots (2)$$

Then, steps 203 through 214 determine which one of predetermined four speed ranges the engine speed Ne falls in, and set flags F1, F2, F3 according to the determined speed range. These flags will be referred to in a routine, described later, for the purpose of performing ignition control dependent on the rotational speed of the engine. There are four speed ranges (I) through (IV) with three range boundaries. The flags are assigned respectively to the range boundaries. Each of the flags is set to "1" if the engine speed Ne is higher than the range boundary to which that flag is assigned, and is set to "0" if the engine speed Ne is lower than the range boundary. Each of the range boundaries is given hysteresis characteristics in order to prevent a flag and hence an ignition control mode from varying frequently due to fluctuation of the engine speed Ne across the range boundary. That is, the critical engine speed for changing a flag as the engine speed Ne is reduced beyond the range boundary is selected to be lower than the critical engine speed for changing the flag as the engine speed Ne is increased beyond the range boundary. The lowest range (I) is a fixed-ignition range in which ignition sparks are produced when the crankshaft is in a certain phase or angular position without advancing the ignition timing. The second lowest range (II) is a speed range in which a calculation for correcting current supply starting timing data Tcg as a basis for controlling the starting of current supply to the ignition coil according to automobile acceleration, and a calculation for correcting current supply stopping timing data (ignition timing data) Tig as a basis for controlling the stopping of current supply to the ignition coil according to automobile acceleration, are performed in the interrupt routine (these calculations will be described later on). The flag F1 is assigned to the range boundary between these ranges (I) and (II). The critical engine speed Ne1L across which the flag F1 changes from "1" to "0" is 400 rpm, and the critical engine speed Ne1H across which the flag F1 changes from "0" to "1" is 500 rpm according to the embodiment. The range (III) that is next lower than the range (II) is a range in which only the above calculation for correcting the ignition timing data (Tig) is effected in the interrupt routine while the calculation for correcting the current supply starting timing data (Tcg) is omitted. The flag F2 is assigned to the range boundary between these ranges (II) and (III). The critical engine speed Ne2L across which the flag F2 changes from "1" to "0" is 2,500 rpm, and the critical engine speed Ne2H across which the flag F2 changes from "0" to "1" is 3,000 rpm according to the embodiment. The highest range (IV) is a range in which both the calculations for correcting the ignition timing data (Tig) and the current supply starting timing data (Tcg) are omitted. The flag F3 is assigned to the range boundary between these ranges (III) and (IV). The critical engine speed Ne3L across which the flag F3 changes from "1" to "0" is 5,000 rpm, and the critical engine speed Ne3H across which the flag F3 changes from "0" to "1" is 5,500 rpm according to the embodiment.

The above calculations are omitted one by one as the engine speed Ne goes from the range (II) through the range (IV) since as the engine speed is increased, the number of cycles in which the interrupt routine is executed in a unit period of time is also increased and the time taken for processing a single cycle of the interrupt routine is reduced.

Comparison between the engine speed Ne and each crical engine speed is carried out by actually comparing their reciprocals. Therefore, rather than the engine speed, the time Te required for the crankshaft to make one revolution, stored in the step 201, and a time required for the crankshaft to make one revolution, corresponding to the rpm at each critical engine speed, are compared in reality. To set the flags, a step 203 first ascertains whether the engine speed Ne is lower than the critical speed Ne1L or not. If yes, then the processing goes to a step 204 in which the flag F1 is set to "0", and then proceeds to a step 205. If not, then the processing goes directly from the step 203 to the step 205. The step 205 ascertains whether the engine speed Ne is higher than the critical engine speed Ne1H or not. If yes, then the processing goes to a step 206 in which the flag F1 is set to "1", and then proceeds to a step 207. If not, then the processing goes directly from the step 205 to the step 207. Similar processes are effected for the flags F2, F3. A step 207 ascertains whether the engine speed Ne is lower than the critical speed Ne2L or not. If yes, then the processing goes to a step 208 in which the flag F2 is set to "0", and then proceeds to a step 209. If not, then the processing goes directly from the step 207 to the step 209. The step 209 ascertains whether the engine speed Ne is higher than the critical engine speed Ne2H or not. If yes, then the processing goes to a step 210 in which the flag F2 is set to "1", and then proceeds to a step 211. If not, then the processing goes directly from the step 209 to the step 211. The step 211 ascertains whether the engine speed Ne is lower than the critical speed Ne3L or not. If yes, then the processing goes to a step 212 in which the flag F3 is set to "0", and then proceeds to a step 213. If not, then the processing goes directly from the step 211 to the step 213. The step 213 ascertains whether the engine speed Ne is higher than the critical engine speed Ne3H or not. If yes, then the processing goes to a step 214 in which the flag F3 is set to "1", and then proceeds to the step 300 in FIG. 4. If not, then the processing goes directly from the step 213 to the step 300.

The steps 300 through 500 shown in FIG. 4 calculate and store the current supply starting timing data Tcg and the ignition timing data Tig which have been referred to above. These data items are indicative of time, and comprise 16-bit binary data items. The current supply starting timing data and the ignition timing data for the control of ignition by the first ignition coil 45, and the current supply starting timing data and the ignition timing data for the control of ignition by the second ignition coil 46 generally have different values except that the two pulsers are angularly spaced at a special angular interval (e.g., the angular interval is equal to a multiple of the angular interval between adjacent two of the reactors. Since, however, the data items are processed in the same manner, the ignition control of only the first ignition coil 45 will be described below. Although the processing steps for the ignition control of the second ignition coil 46 are omitted in the following description, it is to be noted that the same process is effected for the second ignition coil 46 as that for the first ignition coil 45. To clarify the meaning of these data items, certain terms will first be explained below.

First, the stage in which current supply to the ignition coil is started when the current supply starting timing is most advanced is referred to as a "current supply starting stage", and the stage in which current supply to the ignition coil is stopped when the ignition timing is most advanced is referred to as an "ignition stage". The current supply starting timing and the ignition timing are advanced by an increase in the engine speed and other factors. Secondly, the time Pcg to start the current supply starting stage and the time Pig to start the ignition stage (see the timing chart of FIG. 15) are referred to as a "reference current supply point" and a "reference ignition point", respectively. Thirdly, the current supply starting timing data Tcg is a data item indicating a period of time from the reference current supply point Pcg to the time to start the current supply. The ignition timing data Tig is a data item indicating a period of time from the reference igntion point Pig to the time to stop the current supply (ignition time). Inasmuch as the current supply starting stage, the ignition stage, reference points, and both timing data are defined as above, they are different for the first and second ignition coils 45, 46. The base data (described later) on which the above timing data is stored in different storage areas in the ROM 31 of the CPU 22 for the respective first ignition coil 45 and the second ignition coil 46.

For the control of the ignition coil, the CPU 22 is required to have information on the "actual" reference crank angle position. Since the reference crank angle position can be determined by detecting the positions of the reactors on the rotor 15 of the pulse signal generating mechanism 1, therefore, information representative of the relationship between the actual phase of the crankshaft and the phase of the rotor 15 supporting the reactors has to be given to the CPU 22. According to an example in the flowchart of FIG. 10, the reference reactor R7 and the first pulser 17 are relatively positioned so that they are brought into confronting relation when the pistons in the cylinders associated with the first ignition coil 45 are in the top dead center. This information is written in the ROM 31 of the CPU 22. With this arrangement, the reference current supply point Pcg and the reference ignition point Pig correspond to the times at which the third and fifth reactors R3, R5 pass the first pulser 17. However, the actual phase of the crankshaft 14 and the phase of the rotor 15 are not limited to the above relationship, but may be selected for the convenience of control.

The steps 300 through 500 will be described in detail. The step 300 calculates and stores angle of advance data $\theta ig$ indicative of an angle from the crank angle position in which an ignition spark is produced to the reference crank angle position. The angle of advance data $\theta ig$ can be calculated according to the equation given below from two values read from the ROM 31 dependent on the value of Te, and the intake pipe pressure $P_B$ and the coolant temperature Tw which are detected respectively by the intake pressure sensor 9 and the coolant temperature sensor 11:

$$\theta ig = \theta ig_{MAP} + \Delta\theta ig \quad \ldots(3)$$

where $\theta ig_{MAP}$ is basic angle of advance data which is a function ($\theta ig_{MAP}=f(Ne, P_B)$) of the engine speed Ne and the intake pipe pressure $P_B$ and read from an Ne $P_B-\theta ig$ map stored in the ROM 31, and $\Delta\theta ig$ is a corrected value of the angle of advance data which is a function ($\Delta\theta ig=f(Tw)$) of the coolant temperature Tw and read from a Tw$-\Delta\theta ig$ table stored in the ROM 31. The value of the angle of advance data $\theta ig$ has an upper limit equal to a maximum angle of advance $\theta ig'$ (for example, 60°). When the angle of advance determined in the above manner is in excess of the maximum angle of advance $\theta ig'$, it is corrected to this maximum angle of advance $\theta ig'$. The angle of advance data ig thus obtained is stored in the RAM 32.

Then, the step 400 reads, from the ROM 31, current supply time data Ton representative of a period of time for which an electric current is continuously supplied to the ignition coil. The current supply time data Ton is a function of only the engine speed Ne as indicated by the equation (4) below, and is read from an Ne - Ton table stored in the ROM 31 according to the engine speed.

$$Ton = f(Ne) \quad \ldots(4)$$

The current supply time data Ton thus determined is stored in the RAM 32.

After the angle of advance data $\theta ig$ and the current supply time data Ton have been determined, the ignition timing data Tig and the current supply starting timing data Tcg are calculated on the basis of the angle of advance data θig and the current supply time data Ton. The ignition timing data Tig will first be described. The number of the ignition stage ("6" in the example of FIG. 10) and a crank angle θfx (hereinafter referred to as "ignition angle data") from a crank angle position corresponding to the reference ignition point Pig up to the position of the maximum angle of advance θig' are stored in the ROM 31. The CPU 22 reads the ignition angle data θfx and the angle of advance data θig from the ROM 31 and the RAM 32, and calculates an angle DEG from a crank angle position corresponding to the reference ignition point Pig up to a crank angle position corresponding to ignition timing according to the following equation (5):

$$DEG = \theta ig' - \theta ig + \theta fx \qquad \ldots (5)$$

Then, the ignition timing data Tig is calculated from the angle DEG according to the following equation (6):

$$Tig = \Delta T \times DEG \qquad \ldots (6)$$

where ΔT is the time period stored in the RAM 32 in the step 202 of FIG. 6 and required for the crankshaft 14 to turn a crank angle of 1°.

The current supply starting timing data Tcg is calculated from the ignition timing data Tig and the current supply time data Ton, as determined above, according to the following equation (7):

$$Tcg = |(Ton - Tig) - Ts \times m| \qquad \ldots (7)$$

where m is the number of stages (m=1 in the example of FIG. 10) which have passed from the current supply starting stage to the ignition stage, and $\overline{Ts}$ is the average time determined in the step 202 of FIG. 6 and required for the crankshaft to turn a crank angle of 45°. The values calculated as above are stored in the RAM 32.

Figure 7:
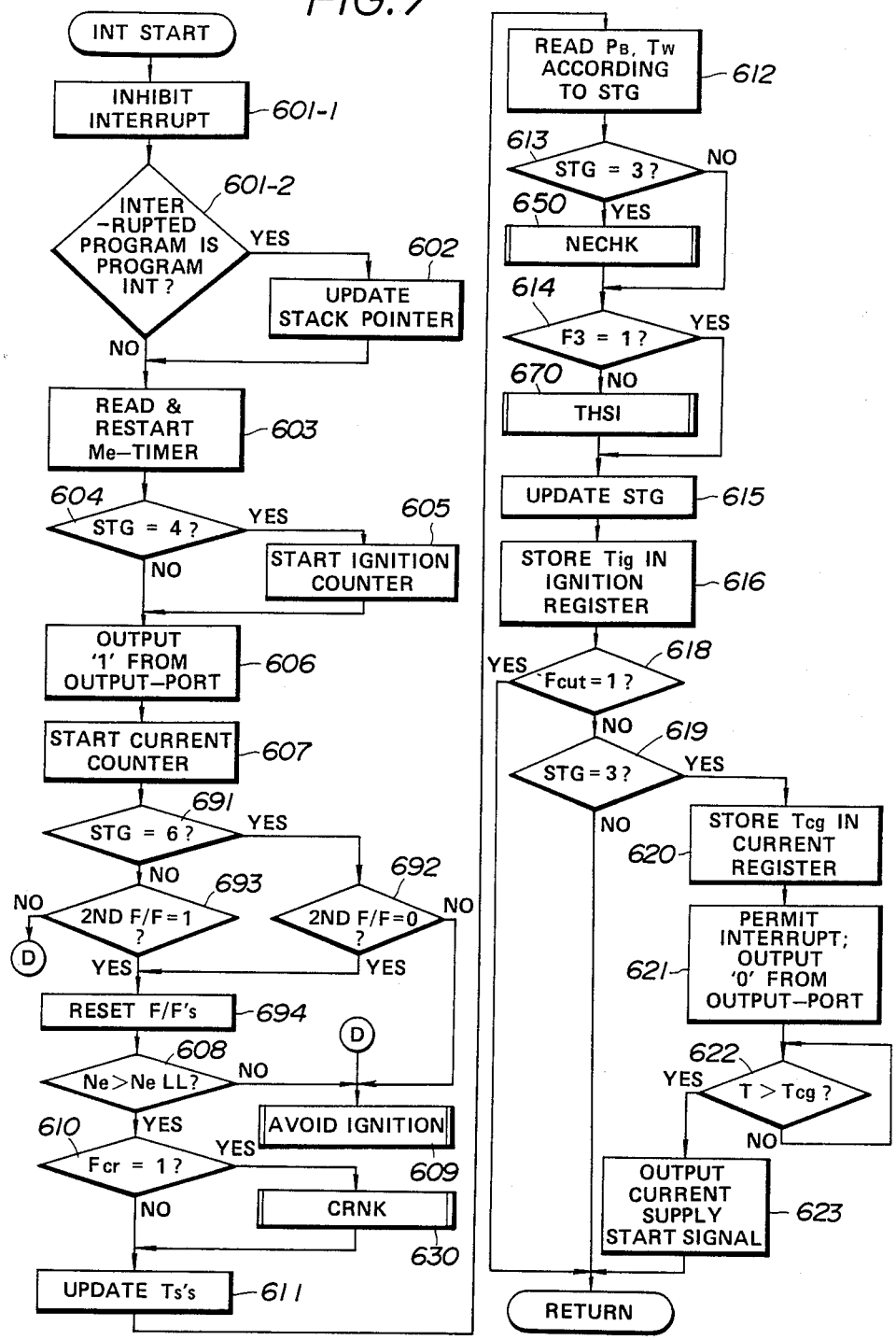
FIG. 7 is a flowchart of a program INT which is executed by interrupting the main routine of FIG. 4 each time a pulse is generated by a first pulser 17 of the pulse signal generating mechanism of FIG. 2 and which includes steps of starting and stopping current supply to ignition coils.

The current supply and ignition will be described with reference to the flowchart of FIG. 7. FIG. 7 shows an interrupt calculation program INT which is executed with high priority each time the Q output signal from the first flip-flop 27 is applied to the CPU 22. Specifically, the interrupt program INT is executed each time a PC1 pulse is generated by the first pulser 17. When the interrupt program INT is executed, the position where the program that has been executed thus far is interrupted is stored in both a stack pointer and another register, and thereafter control is transferred from that program to the interrupt program INT.

First, an interrupt is inhibited in a step 601-1. A next step 601-2 ascertains whether or not the interrupt program INT which has started being executed when the previous PC1 pulse is applied is not yet completed and the present interrupt is executed during the previous interrupt routine. If not, then the program goes to a step 603 which reads and stores the measured value from the Me timer 47 and then resets and restarts the Me timer 47. Thereafter, the processing proceeds to a step 604 which checks the value of the variable STG to ascertain whether or not the present stage is the ignition stage (5th stage) in which the first ignition counter circuit 36 is to be started for counting the applied signal. If the variable STG is "4", then the present stage is the 5th stage. If yes in the step 604, the CPU 22 delivers a starting signal to the first ignition counter circuit 36 to start same in a step 605, and then the processing goes to a step 606. The starting signal is applied to the set terminal S of the SR flip-flop 50 (FIG. 3) of the first ignition counter circuit 36 to cause its Q output terminal to generate a "1" level. The "1" level generated by the Q output terminal of the flip-flop 50 enables the AND gate 49 to start to apply the clock signal to the clock terminal CK of the first counter 39a.

If not in the step 604, the processing proceeds directly to the step 606 in which a "1" level is produced on the first output port 22a of the CPU 22. The "1" level on the first output port 22a is supplied over an enable signal line 40a to the first drive circuit 24a. The first drive circuit 24a serves to start energizing the first ignition coil 45 only when the output signal from the first output port 22a is inverted from "0" to "1". Therefore, when the output level of the first output port 22a is originally "1", the first drive circuit 24a remains functionally unchanged even if the "1" level is produced on the first output port 22a. When a "0" level has previously been produced on the first output port 22a to put same in a standby condition, the first drive circuit 24a can start energizing the first ignition coil 45 by executing the step 606.

Then, the processing goes to a step 607 for starting the internal counter serving as the current counter. Therefore, the current counter is started each time the interrupt program INT is executed. The processing goes on to a step 691 which ascertains whether the present stage is the 7th stage by referring to the variable STG. If the variable STG is "6", the present stage is the 7th stage. As long as the PC1 and PC2 pulses are properly generated, transferred, and processed, and the ignition timing control device functions properly, the output signal from the second flip-flop 28 is "1" when the stage 691 is executed in the 7th stage, and "0" when the stage 691 is executed in the other stages. Therefore, the ignition timing control device can be checked for its operation by checking the output signal of the second flip-flop 28 following the step 691. Such checking is performed by steps 692, 693. If the answer to the decision step 691 is yes, then the step 692 ascertains whether the output signal from the second flip-flop 28 is "0". If "0", then the processing proceeds to a step 694, and if not, then the processing goes to a step 609 in which ignition is avoided and then ignition control is restarted from the step 100. If not in the step 691, the step 693 checks if the output signal from the second flip-flop 28 is "1" or not. If "1", then the processing goes to the step 694, and if not, then the processing jumps via a connector D to the step 609 for restarting ignition control. In the step 694, the CPU 22 generates a clear signal to reset the first and second flip-flops 27, 28. The output signals from the first and second flip-flops 27, 28 are as shown in the timing chart of FIG. 10. Then, the processing proceeds to a step 608 to ascertain whether the engine speed Ne is in excess of a lower limit speed NeLL (for example, 200 rpm) above which the engine and the ignition timing control device are supposed to operate stably. If the engine speed Ne is not in excess of the lower limit speed NeLL, then the processing goes to the step 609 in which ignition is avoided to prevent the engine from being adversely affected by an ignition failure. If the engine speed Ne is in excess of the lower limit speed NeLL, then a step 610 ascertains whether the fixed ignition control should be performed by checking if the value of a flag Fcr is equal to "1" or not. If the flag Fcr is equal to "1", then fixed ignition control subroutine CRNK (described later) is executed. And also the ignition counter started in the step 605, or a process for cancelling its output signal is executed. If the flag Fcr is "0", then the processing proceeds to a step 611 in which the earliest stored one of the 7 stored stage lengths Ts is rewritten by the length of the latest completed stage measured in the step 603 of the presently executed interrupt routine, thus updating the Ts values. The updated Ts values are used for calculating the value of Me in the step 201 of FIG. 6.

Then, a step 612 refers to the variable STG to ascertain whether the present stage is the 2nd or 5th stage, and dependent on the result, the intake pressure $P_B$ and the coolant temperature Tw which are detected by the intake pressure sensor 9 and the coolant temperature sensor 11 are read. Specifically, parameters to be read are dependent on the stage. The intake pressure $P_B$ is read in the 2nd stage, and the coolant temperature Tw is read in the 5th stage.

Steps 613, 650 ascertain whether the engine speed is excessive. The step 613 refers to the variable STG to check if the present stage is the 4th stage. The 4th stage corresponds to the 4th area A4 with its crank angle being 90°, and has an angular extent twice that of the other stages. The program execution time for the 4th stage is therefore twice that for the other stages, and the 4th stage allows calculations to be performed which cannot be carried out in the other stages during high-speed rotation of the engine. This is based on the arrangement that the crank angle position is detected by the two pulsers 17, 18 and the reactors R1 through R7 on the rotor 15 with one reactor-free space thereon. If the answer to the decision step 613 is no, then it is possible that the time required to check if the engine speed is excessive or not may not be maintained. Therefore, the processing jumps to a step 614 . by bypassing the step 650 and. If yes in the step 614, the processing goes to the step 650 to execute a subroutine NECHK.

Figure 8:
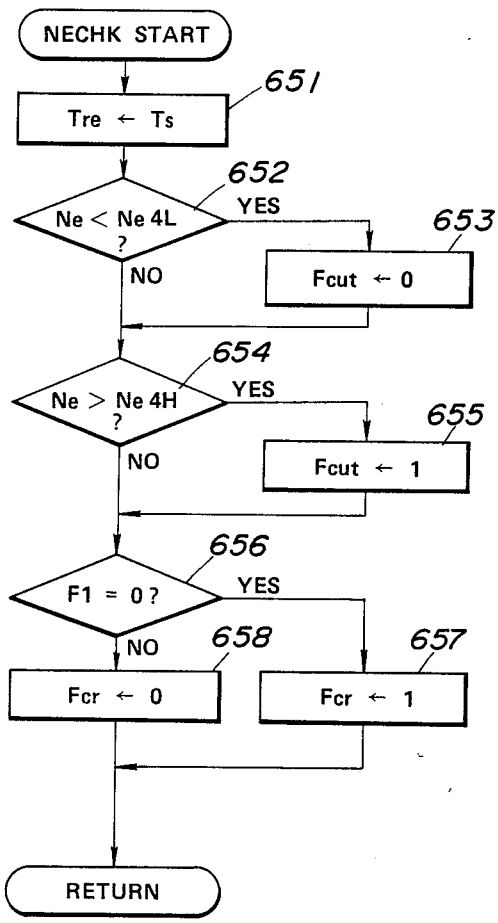
FIG. 8 is a flowchart of an operation sequence of a step 650 in the program INT illustrated in FIG. 7.

FIG. 8 shows a flowchart of the subroutine NECHK. A step 651 stores, as a variable Tre, the length Ts of the latest completed stage which has been stored in the step 611 of FIG. 7 (since the subroutine NECHK is executed after the PC1 pulse generated by the 4th reactor R4 has been detected, the latest Ts value is the length of the 3rd stage). The variable Tre will be referred to in subsequent steps 652, 654. The step 652 determines whether the engine rotation has been brought out of the excessive rotation condition by checking if the engine speed Ne is lower than a predetermined critical speed Ne4L (for example, 15,000 rpm) or not. If yes in the step 652, a flag Fcut is set to "0" to store the condition that the engine rotation is no longer excessive (step 653). If not in the step 652, then the processing goes to the step 654 for checking whether the engine rotation is in the excessive rotation condition. This can be carried out by ascertaining the engine speed Ne is higher than a predetermined critical speed Ne4H (for example, 16,000 rpm). If yes in the step 654, the flag Fcut is set to "1" to store the condition that the engine rotation is excessive (step 655). If not in the step 654, then the processing proceeds to a step 656. The engine speed Ne is compared with the two different critical speeds Ne4L, Ne4H in the steps 652, 654 in order to stabilize engine control.

The step 656 ascertains whether the flag F1 is "0" or not. The value of the flag F1 has been set in the step 204 or 206 in FIG. 3. If the flag F1 is "0", it means that the engine speed Ne is in the speed range I, and the flag Fcr is set to "1" in a step 657 so as to perform the fixed ignition control. If the flag F1 is not "0", then the flag Fcr is set to "0" in a step 658. The flag Fcr is referred to in the step 610 of FIG. 7. After the flag Fcr has been set, the execution of the subroutine NECHK is completed, and the processing then goes to the step 614 of FIG. 7.

The step 614 ascertains whether the flag F3 that has been set in the step 212 or 214 of FIG. 6 is "1" or not. If yes, then the processing goes to a step 615 without correcting the current supply starting timing data Tcg and the ignition timing data Tig according to the automobile acceleration. If not in the step 614, then a subroutine THSI is executed in a step 670 to correct both the current supply starting timing data Tcg and the ignition timing data Tig or only the ignition timing data Tig according to the automobile acceleration. This acceleration-dependent correction of these data items will be described with reference to the flowchart of FIG. 9.

A step 671 ascertains whether the variable STG is "4" or not for detecting if the latest completed stage is the stage 4. If yes, this means that the length Ts of the latest measured stage which has been measured in the step 603 and stored in the step 611 has been determined as the time required for the crankshaft to turn the crank angle of 90° in the stage 4. Therefore, a value obtained by dividing the latest Ts value by 2 is stored as a T1 value in a step 672. If not in the step 671, the latest Ts value is stored as the T1 value in a step 673. Then, a step 674 ascertains whether the variable STG is "5" or not for detecting if the stage preceding the latest completed stage has been the stage 4. If yes, this means that the length Ts of the second latest measured stage which has been stored has been determined as the time required for the crankshaft to turn the crank angle of 90° in the stage 4. Therefore, a value obtained by dividing the second latest Ts value by 2 is stored as a variable T2 value in a step 675. If not in the step 674, the second latest Ts value is stored as the T2 value in a step 676. A next step 677 calculates and stores the difference ΔTs between the times T1, T2 required for the crankshaft to turn the crank angle 45° in the latest completed stage and the preceding stage, respectively, according to the following equation (8):

$$\Delta Ts = T1 - T2 \ldots \quad (8)$$

Then, a step 678 checks if the absolute value of this difference |ΔTs| is larger than a predetermined ΔTa or not. If not, the engine acceleration or deceleration is regarded as negligible, and the processing goes to a step 680. If yes, the engine acceleration or deceleration is not negligible. In this case, since it is expected that the length Ts of the present stage is substantially the sum of the T1 value and the difference ΔT obtained in the step 677, the variable T1 is rewritten by this sum in a step 679, and then the processing goes to the step 680. The step 680 stores the T1 value as a $Ts_{NEW}$ value. Then, a next step 681 determines a time $\Delta T_{NEW}$ required for the crankshaft to turn the crank angle of 1° from the $Ts_{NEW}$ value.

Figure 9:
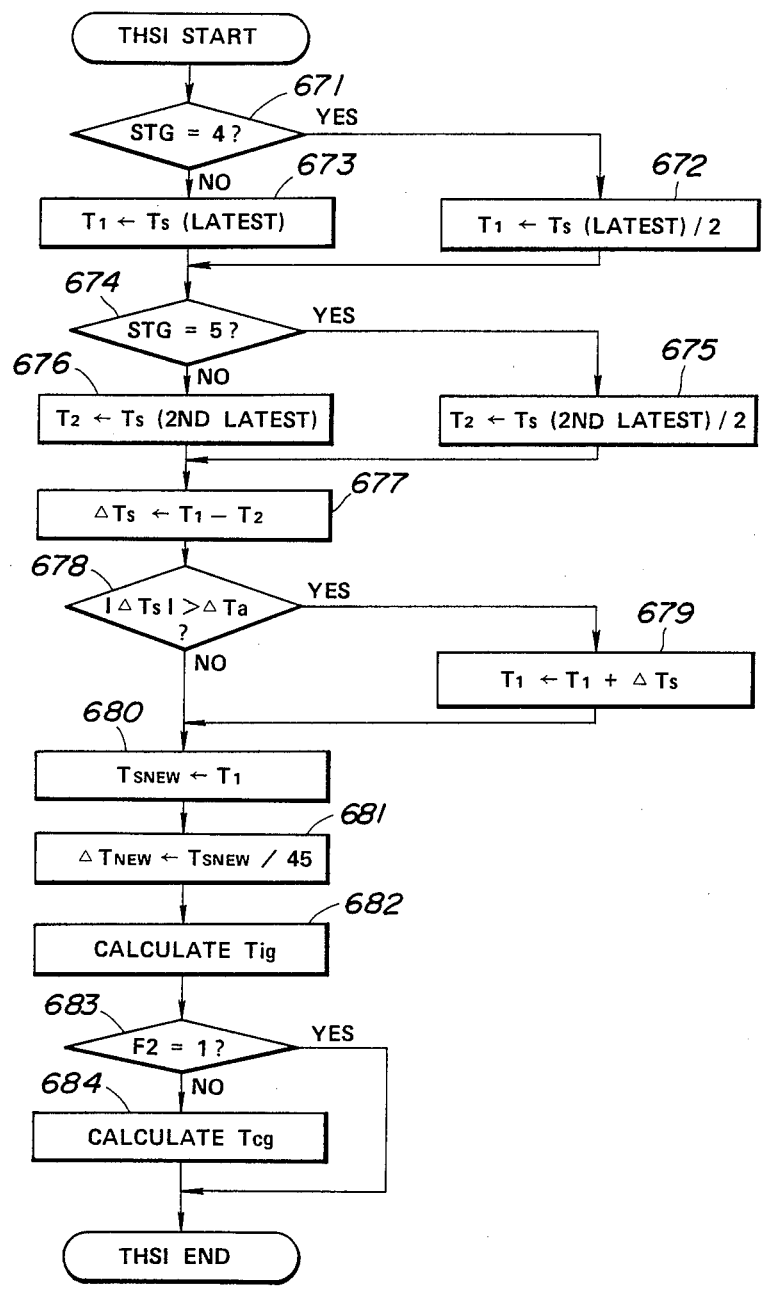
FIG. 9 is a flowchart of an operation sequence of a step 670 in the program INT of FIG. 7.

In following steps 682, 684, the ignition timing data Tig and the current supply starting timing data Tcg are recalculated on the basis of the $Ts_{NEW}$ value and the $\Delta T_{NEW}$ value. Specifically, the step 682 first recalculates the ignition timing data Tig to determine the latest Tig value with the above $\Delta T_{NEW}$ value used as the ΔT value in the equation (6). Then, a step 683 ascertains whether the flag F1 is set to "1" or not. If not, i.e., the engine speed Ne is within the range II, then the current supply starting timing data Tcg is recalculated according to the equation (7) used in the main routine on the basis of the recalculated ignition timing data Tig and the above $Ts_{NEW}$ value. If yes in the step 683, then only the ignition timing data Tig is recalculated, but the current supply starting timing data Tcg is not recalculated, in the step 684. The subroutine program of the flowchart shown in FIG. 9 is now ended, and the processing goes back to a step 615 shown in FIG. 7.

The step 615 checks the value of the variable STG indidicative of the stage position, and updates the variable STG by incrementing it by 1 if it is in the range of from "1" to "6". If the value of the variable STG is "7", then the variable STG is not incremented but updated to "0". After the variable STG has been updated, the variable STG is in accord with the stage number until the next pulse is input from the first pulser 17.

Figure 11:
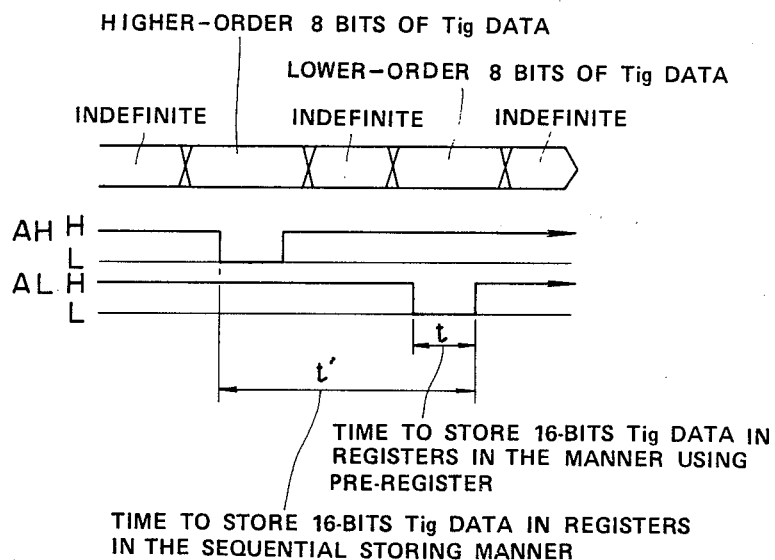
FIG. 11 is a timing chart of signal transfer in a data bus at the time ignition timing data is stored in registers in the ignition counter circuit of FIG. 3.

Then, the ignition timing data Tig stored in the RAM 32 is set in the registers in the ignition counter circuit 36 in a step 616. More specifically, the CPU 22 stores the ignition timing data Tig in the first and second registers 38a, 38b (FIG. 3) of the ignition counter circuit 36 in the following manner: First, the CPU 22 delivers the higher-order 8 bits of the 16-bit ignition timing data Tig over the data bus 43, and thereafter applies a latch signal AH to the pre-register 42 (FIG. 11). The pre-register 42 stores the higher-order 8 bits of the Tig data in timed relation to the application of the latch signal AH. Then, the CPU 22 delivers the lower-order 8 bits of the Tig data over the data bus 43, and thereafter applies a latch signal AL simultaneously to the first and second registers 38a, 38b (FIG. 11). In response to the latch signal AL, the first register 38a stores the lower-order 8 bits of the Tig data that have been delivered over the data bus 43, and the second register 38b stores the higher-order 8 bits which are stored in the pre-register 42. If the higher-order 8 bits of the Tig data were stored in the second register without using the pre-register, and then the lower-order 8 bits were stored in the first register, then at least a time t' (FIG. 11) from the time when the latch signal AH is delivered to the time when the latch signal AL is delivered would be required. According to the present invention using the pre-register 42, the Tig data is stored in the register substantially simultaneously with the delivery of the latch signal AL (see store time t in FIG. 11). Therefore, the sequential storing process of the present invention does not require any means for preventing malfunctioning of the comparators during data storage, such as a program and a counter for confirming that the time t' required for rewriting the Tig data is smaller than a time expressed as the difference between the count of the counter and the Tig data already stored in the register.

Unless the engine speed Ne is in the range IV which is a relatively high-speed range, the latest ignition timing data Tig as corrected by the subroutine THSI in the step 670 is set in the ignition register in the step 616. Since the storage of the ignition data Tig into the ignition register is always carried out by the interrupt program INT, the Tig data is rewritten each time the interrupt program INT is executed. The timing chart of FIG. 10 shows at (g) the value of the stored Tig data.

Then, a step 618 of FIG. 7 is executed. The step 618 checks if the flag Fcut set in the subroutine NECHK is equal to "1" or not. If not, a step 619 and following are executed. If yes, i.e., the engine speed Ne is in the excessive rotation range, then the step 619 and following are not executed, and the interrupt routine is brought to an end. Therefore, current supply to the ignition coil is stopped and the air-fuel mixture will not be ignited, thus preventing the engine from being rotated at the excessive speed.

The step 619 ascertains whether the variable STG is "3" or not in order to detect if the present stage is the current supply starting stage or not. If not in this step 619, then a process for starting current supply is not executed, and the interrupt subroutine is completed. Thus, the CPU 22 does not apply a current supply starting signal to the first drive circuit 24a although the CPU 22 has started the current counter. If yes in the step 619, the processing goes to a step 620 in which the current supply starting data Tcg stored in the RAM 32 is set in the current register. Then, the processing goes to a step 621 in which the CPU 22 is readied for permitting a reinterrupt and the output signal from the first output port 22a of the CPU 22 is set to the "0" level. During a time period after the interrupt has been inhibited in the step 601-1 an before the interrupt is permitted in the step 621, a high-level signal even if applied to the INT terminal of the CPU 22 is neglected, and the interrupt sourtine of FIG. 7 will not be restarted. The interrupt is inhibited during this time period because environmetally induced noise would otherwise be gnerated in the pulse signal generating mechanism 1 and wires connected thereto, causing the CPU 22 to malfunction The process from the step 601-1 to the step 620 can be completed before a next PC1 pulse is generated, even when the engine speed Ne is in the excessive rotation range so that ignition is stopped in the step 618. Therefore, no genuine re-interrupt request according to a PC1 pulse will possibly be produced while the steps 601-1 through 620 are being executed. With the first output port 22a of the CPU 22 being set to the "0" level, the first drive circuit 24a is brought into a standby condition via the enable signal line 40a. The first drive circuit 24a can now energize the ignition coil 45 when the output signal from the first output port 22a is inverted from the "0" level to the "1" level.

Then, the processing goes to a step 622 which compares the count T of the current counter implemented in the RAM 32 and the current supply starting timing data Tcg in the current register. The step 622 is repeatedly executed until the count T exceeds the current supply starting timing data Tcg. That is, the interrupt program INT will not be brought to an end unless there is a reinterrupt request until the current supply starting timing Tcg is exceeded in the current supply stage.

When the count T is in excess of the current suppply starting timing data Tcg, the CPU 22 outputs a "1" level to the first output port 22a. Stated otherwise, the CPU 22 delivers a current supply starting signal to the first drive circuit 24a to supply an electric current to the primary winding of the first ignition coil 45 (step 623). The interrupt routine is now ended.

The above control sequence is effected when there is not re-interrupt request after the step 621. When the engine speed is abruptly increased while the engine is being quickly accelerated and a next PC1 pulse is generated during the execution of the step 622, the process being executed is interrupted, and the step 601 is executed again. At this time, the answer to the decision step 601 becomes yes, and the processing goes to a step 602 in which the stack pointer is updated. The stack pointer is generally a last-in-first-out register for storing a stack of interrupted program points when the execution of one program routine is interrupted by an interrupt command or a command to transfer to a subroutine. For preparing a program from a flowchart, it has heretofore been customary to employ an existing routine as a subroutine. Hence, during the execution of a process, a stack pointer generally stores a stack of addresses of many interrupted program points. According to the method of the embodiment, if, during the execution of an interrupt routine (hereinafter referred to as a "first interrupt routine"), an interrupt request is generated by a next PC1 pulse and the first interrupt routine is interrupted by another interrupt routine (hereinafter referred to as a "second interrupt routine"), the processing will not return to the first interrupt routine to execute the remaining instructions thereof after the execution of the second interrupt routine is completed. Rather, the processing will return from the second interrupt routine to the point of the main routine which was interrupted by the first interrupt routine. Therefore, the processing is carried out in the following manner: When the processing enters the interrupt routine, the interrupted point of the main routine is stored in another register as well as the stack pointer. Therefore, the CPU 22 successively reads the addresses stored in the stack pointer, and compares the addresses with the address in this register until the compared addresses are found to be the same. When the compared addresses conincide with each other, the content of the register is stored in the stack pointer. Through this process, all of the addresses stored in the stack pointer while the first interrupt routine is being executed are discarded, and the processing goes back directly to the main routine after the execution of the second interrupt routine has been completed.

Then, the processing goes to the step 606 to output the "1" level to the first output port 22a of the CPU 22 for thereby enabling the first drive circuit 24a to energize the first ignition coil 45. At this time the count of the current counter has not yet reached the value of the current supply starting timing data Tcg established as described above. However, the current supply to the first ignition coil 45 is started by the execution of the step 606.

When the clock signal is started to be applied to the clock terminal CK of the first counter 39a in the first ignition counter circuit 36 in the I/O LSI 21 in response to the starting signal applied from the CPU 22 in the step 605, the first counter 39a increments the count by 1 each time the clock signal is applied. The count of the second counter 39b is incremented by 1 in timed relation to the inversion from the "1" level to the "0" level of the output signal from the MSB output terminal of the first counter 39a (see FIG. 3). The first comparator 41a compares the count of the first counter 39a and the lower-order 8 bits of the Tig data stored in the first register 38a, and outputs a conincidence signal to the second comparator 41b when the compared data are found to be the same. The second comparator 41b compares the count of the second counter 39b and the higher-order 8 bits of the Tig data stored in the second register 38a, and supplies a current supply stopping signal, i.e., an ignition signal to the first drive circuit 24a to thereby stop the current supply to the primary winding of the first ignition coil 45 when the compared data are found to be the same and the above coincidence signal from the first comparator 41a is applied. A high voltage is now induced across the secondary winding to enable the ignition spark plug 10a to produce a spark, thus igniting the air-fuel mixture.

The ignition signal from the second comparator 41b is also supplied to the reset terminals R of the first and second counters 39a, 39b and the SR flip-flop 50, resetting the counts of the first and second counters 39a, 39b to zero and inverting the output signal from the Q output terminal of the flip-flop 50 to the "0" level, so that the AND gate 49 cuts off the clock signal. The first and second counters 39a, 39b will not start counting the clock signal until a next starting signal is applied thereto.

The counting for generating the ignition signal based on the ignition timing data Tig is performed in the ECU 2 by the first and second ignition counter circuits 36, 37 in the I/O LSI 21. The counting for generating the current supply starting signal based on the current supply starting timing data Tcg is executed by the program in the CPU 22. However, a counter circuit for the current supply starting signal, which is of the same construction of the ignition counter circuits for the ignition signal, may be provided outside of the CPU 22, and the function of the counting for the current supply starting signal may be transferred from the CPU 22 to such an external counter circuit.

The arrangement of the ignition counter circuits described above is employed where the ignition timing control device comprises a CPU having an 8-bit data bus and 16-bit ignition timing data is processed by such a CPU. Where the ignition timing control device comprises a CPU having a 4-bit data bus and 16-bit ignition timing data is processed by such a CPU, however, the counter circuits may be changed as follows: The first and second registers 38a, 38b are replaced with four partial registers connected in series for storing 4-bit data items, respectively, which are obtained by dividing the ignition timing data. Three higher-order partial registers out of the four partial registers are combined with respective 4-bit pre-registers. In the counter circuit thus constructed, the four 4-bit data items of the ignition timing data are transferred, one at a time from higher-order data items, to the respective pre-registers. Thereafter, at the same time that the low-order 4-bit data item is stored in the low-order partial register, the data items stored in the pre-registers are transferred respectively to the partial registers combined with the pre-registers.

Figure 14:
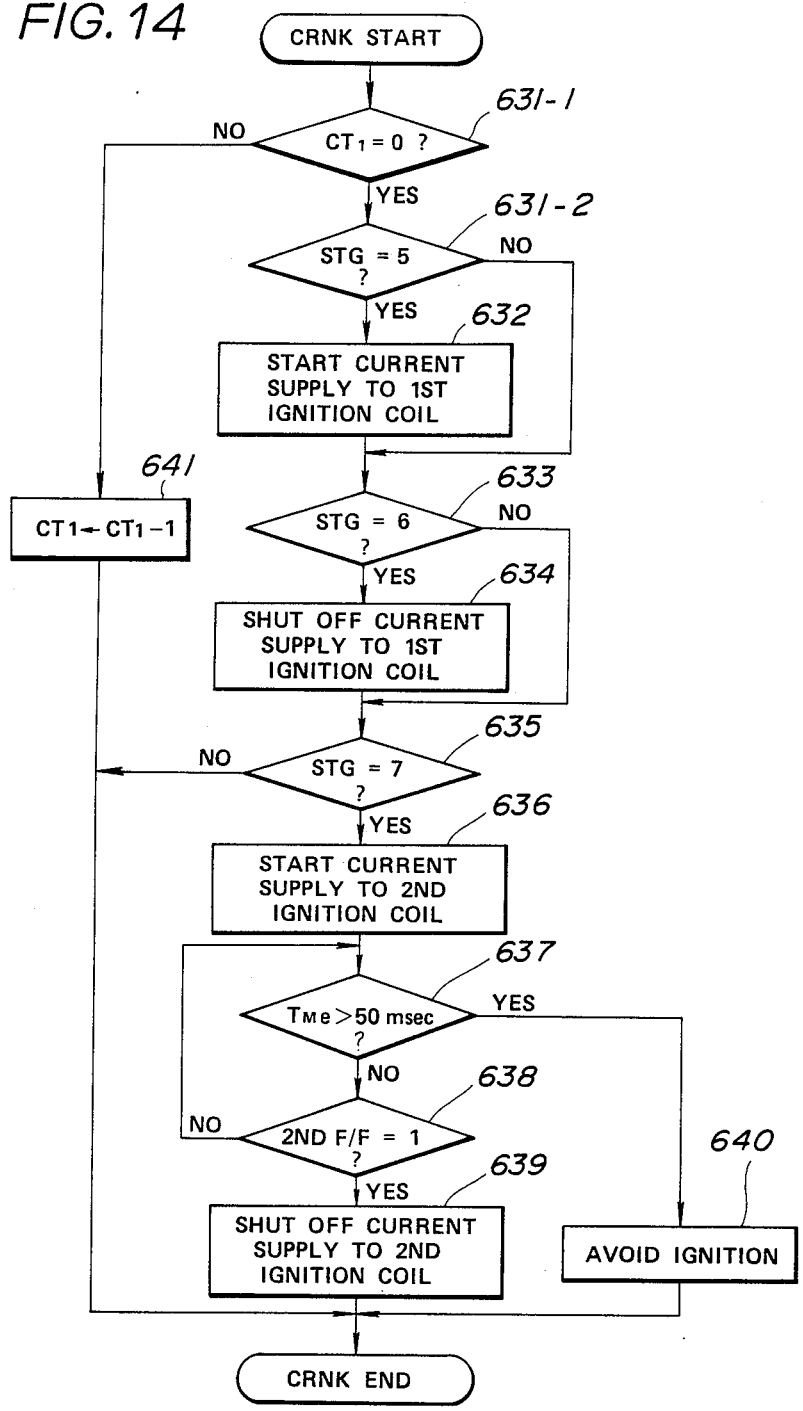
FIG. 14 is a flowchart of a subroutine CRNK in the program INT of FIG. 7.

The fixed ignition control subroutine CRNK executed in the step 630 will be described below. The fixed ignition control is executed when the engine speed Ne is very low. For example, it is executed when the engine rotates upon cranking at a speed which is lower than a normal idling speed. In such a case, the rate of variation of the engine speed is large, and hence calculated ignition timing data may widely deviate from appropriate ignition timing. To avoid this, ignition is controlled in the following manner: Ignition is effected when the crankshaft reaches substantailly the top dead center. According to the arrangement of the embodiment, the reference reactor R7 enables the first pulser 17 to generate a PC1 pulse when the crankshaft reaches the top dead center in the cylinder associated with the first ignition coil 45, and enables the second pulser 18 to generate a PC2 pulse when the crankshaft reaches the top dead center in the cylinder associated with the second ignition coil 46. The fixed ignition control is performed on the basis of such arrangement. For effecting the fixed ignition control, the CPU 22 outputs fixed ignition signals to the drive circuits 24a and 24b according to the subroutine CRNK in the step 630 shown in FIG. 7. The flowchart of FIG. 14 represents the subroutine CRNK executed in the step 630 shown in FIG. 7. If it is determined in the step 608 that the engine is to be operated under fixed ignition control, a step 631-1 ascertains whether the variable CT1 is "0" or not. When the crankshaft has not been rotated through one revolution from the engine start, the variable CT1 is not "0", and the variable CT1 is decremented by 1 in a step 641. Without carrying out ignition, the processing proceeds from this subroutine to the step 611 (FIG. 7). If the answer to the decision step 631-1 is YES, then the variable STG is referred to in a step 631-2 to ascertain whether the present stage is the 6th stage or not. If yes, then current supply to the first ignition coil 45 is started in a step 632. If not, then the processing goes to a next step 633. If the variable STG is "5", the present stage is the 6th stage.

The step 633 checks if the present stage is the 7th stage or not. If yes, current supply to the first ignition coil 45 is shut off to enable the first ignition plug 10a to produce a spark in a step 634. Specifically, at the same time that a PC1 pulse generated by the 6th reactor R6 indicative of the beginning of the 6th stage is detected, the first ignition coil 45 is started to be energized. Simultaneously with the detection of a PC1 pulse generated by the 7th reactor R7 indicative of the beginning of the 7th stage, the first ignition coil 45 is de-energized to enable the spark plug connected thereto to spark. If not in the step 633, the processing proceeds to a step 635.

The step 635 ascertains whether the present stage is the 1st stage or not by checking the variable STG. If yes, then the second ignition coil 46 is energized in a step 636, and then a step 637 checks if the value of the Me timer 47 restarted in the step 603 of FIG. 7 has reached a prescribed value (for example, 50 msec.) or not. If not, i.e., the Me timer count has not yet reached the prescribed value, then the processing proceeds to a step 638 which ascertains whether the Q output of the second flip-flop 28 is of high level or not. If high level, i.e., a PC2 pulse generated substantially in the top dead center position of the cylinder ignited by the second ignition coil 46 at the intermediate time of the 2nd stage is detected, then the current supply to the second ignition coil 46 is shut off to enable the spark plug connected thereto to produce a spark in a step 639. For an engine with its top dead centers spaced at different angular intervals from the above crank angle, the second pulser 18 may be angularly spaced from the first pulser 17 by an angular interval dependent on the intervals between the top dead centers of the engine, so that ignition can be carried out in substantially the same crank angle position as the top dead centers of the cylinders having the second ignition plugs.

If not in the step 638, i.e., the PC2 pulse in the 2nd stage is not yet detected, then the processing returns to the stage 637, and the detection of the PC2 pulse is awaited while the second ignition coil 46 is being continuously energized. If the count of the Me timer 47 has reached the prescribed value (50 msec.) during this wait period (i.e., the answer to the decision step 637 is yes), however, the processing goes to a step 640 in which ignition by the second ignition coil 46 is avoided by gradually reducing the current flowing through the primary winding of the second ignition coil 46. The ignition by the second ignition coil 46 is avoided for the following reason: The time from the beginning of the 2nd stage until the PC2 pulse in the 2nd stage is detected is at most 37.5 msec. as long as the engine speed is 200 rpm or higher. Therefore, the fact that the Q output from the second flip-flop 28 remains low after 50 msec. has elapsed indicates that the PC2 pulse has failed to be detected. such a detection failure is more likely to occur as the engine speed Ne goes lower and the output level of the PC2 pulse becomes lower. To prevent ignition in an unwanted engine operation stroke, which would otherwise be caused then a subsequently generated PC2 pulse is detected, the above process of avoiding ignition is effected. During energization of the first ignition coil in the steps 631-2 through 634, the first ignition coil is prevented by the processing in the steps 608, 609 from failing to operate due to failure of detection of the PC1 pulse.

Figure 12:
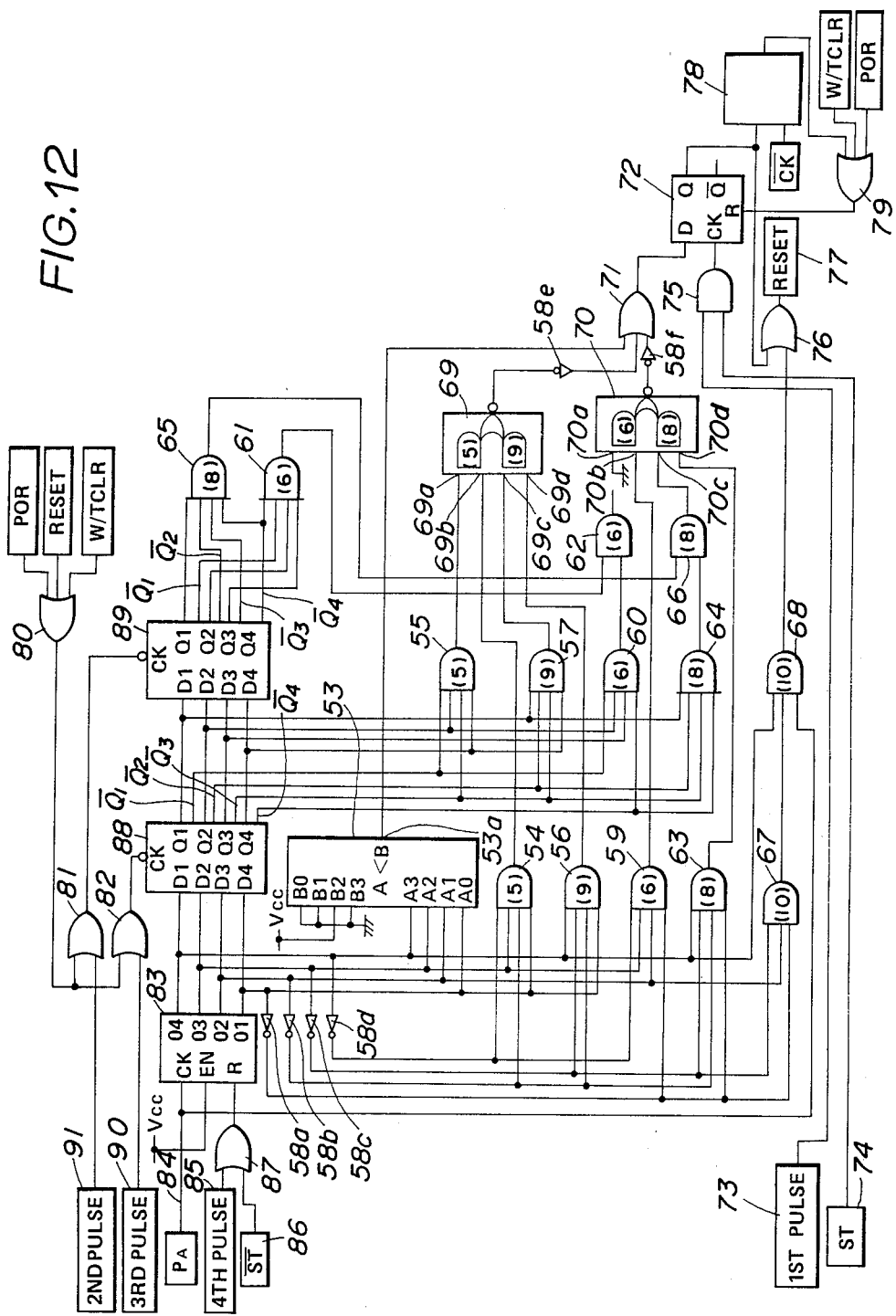
FIG. 12 is a circuit diagram of a fail-safe circuit 30 in the electronic ignition timing control device of FIG. 1.
Figure 13:
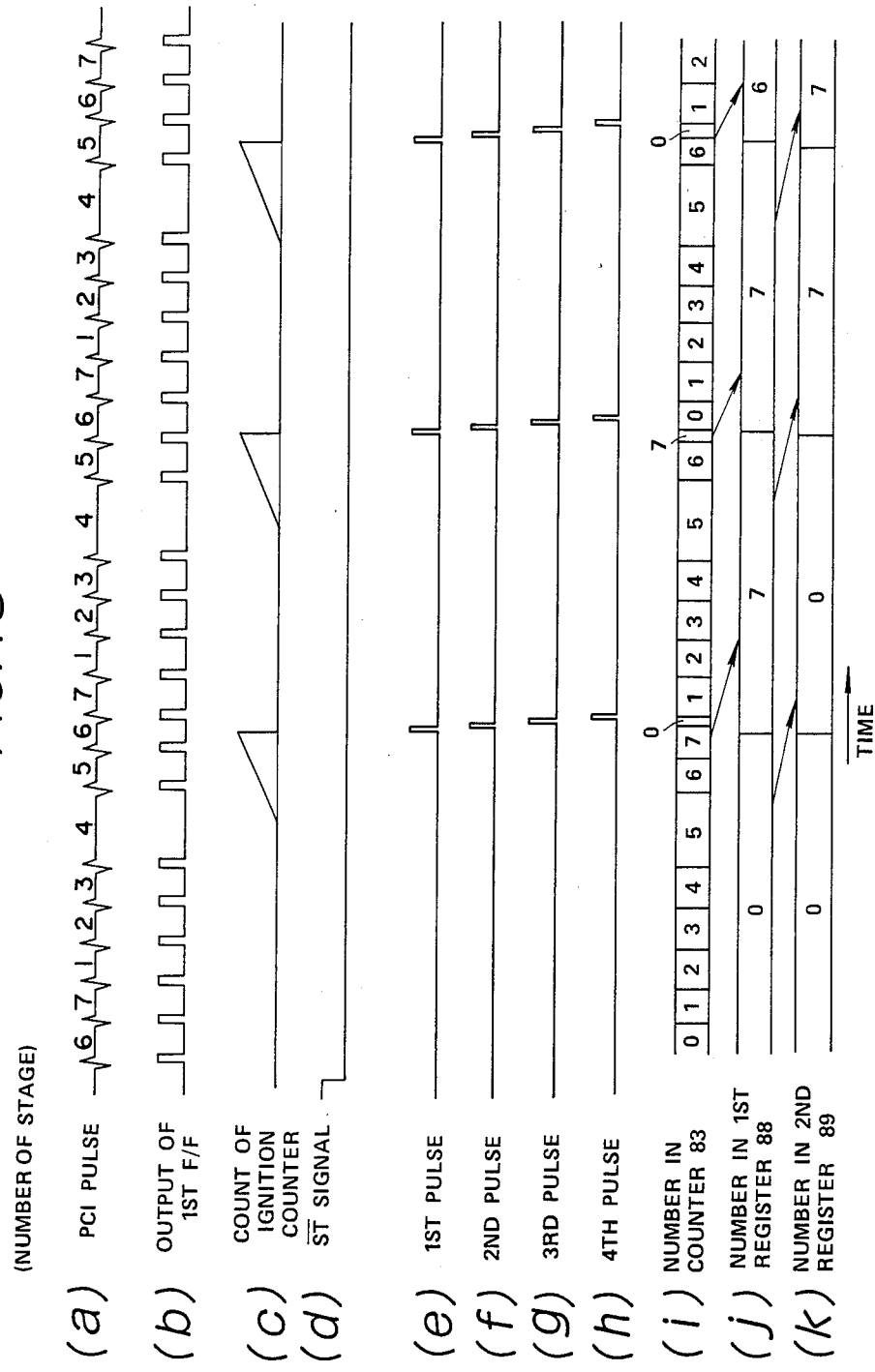
FIG. 13 is a timing chart of signals applied to and generated by the fail-safe circuit of FIG. 12 and data items stored therein.

The fail-safe circuit 30 in the I/O LSI 21 will now be described for its construction and operation with reference to FIGS. 12 and 13.

The ignition timing control device has two output systems including the first and second ignition coils 45, 46, respectively. The output timing of the output system including the first ignition coil 45 is supervised by the fail-safe circuit 30 for a failure of the output timing of the ignition timing control device.

The number of pulses PC1 generated in one operation cycle, i.e., one ignition period between successive ignitions, stated otherwise, the number PA of pulses issued by the first flip-flop 27 is counted three times, i.e., in the latest completed ignition period, the second latest ignition period, and the third latest ignition. The output timing of the ignition timing control device is determined as a failure or being abnormal when the above three pulse counts PA are in a predetermined numerical relationship. When the output timing is determined as a failure or being abnormal, the I/O LSI 21 outputs a reset signal to reset the CPU 22 for thereby inhibiting the execution of ignition. A combination of PC1 pulse counts PA used for determining an output timing failure is given by way of example in the table 3.

TABLE 3

| | Number (PA) of PC1 pulses counted counted in an ignition cycle | | | |
| --- | --- | --- | --- | --- |
| Case | Latest cycle | Second latest cycle | Third latest cycle | Decision |
| 1 | 4 or less | any | any | anomaly |
| 2 | 5 | 5 | any | anomaly |
| 3 | 6 | 6 | 6 | — |
| 4 | 7 | 7 | 7 | — |
| 5 | 8 | 8 | 8 | anomaly |
| 6 | 9 | 9 | any | anomaly |
| 7 | 10 or more | any | any | anomaly |

An operation in which no failure or abnormality is found and the CPU 22 is not reset will first be described. As shown in FIG. 2, the seven reactors R1 through R7 are disposed on the rotor 15. Therefore, as long as the ignition timing is normal and the engine rotates at a constant speed, the pulse signal generating mechanism is supposed to produce seven PC1 pulses during one igntion period bewteen successive ignitions. When the PC1 pulse count PA is "7" each time it is detected as indicated in the case 4 of the table 3, the CPU 22 is not reset. When the pulse count PA is "6", the engine speed is in a relatively high-speed range. At this time, a PC1 pulse and a counter reset signal (described later) may be overlapped as when the interval of PC1 pulse generation is reduced, and such an overlapped PC1 pulse will not be counted. It is thus possible for the PA pulse count "6" in the case 3 of the table 3 to be successively counted when the ignition control is normal. In this case, the CPU 22 is also not reset.

An operation in which a failure or an abnormality is detected will be described. The output timing may become abnormal when the CPU 22 malfunctions to generate inappropriate ignition signals, effecting ignitions which are not properly timed. The CPU 22 may malfunction such as when noise is produced in signal lines in the ECU2 due for example to an electromagnetic wave induced by a spark generated by a spark plug. Since the pulse count PA is not "4" or less if the ignition timing control device operates normally, the output timing will be judged anomaly when the pulse count PA in the latest completed ignition period is "4" or less as in the case 4 of the table 3, irrespectively of the pulse counts in the second and third latest ignition periods or cycles.

Operations in which the pulse counts PA are "5", "8", and "9" will be described. As described above, the angular areas between the reactors on the rotor 15 of the pulse signal generating mechanism 1 having angular intervals each equal to a crank angle of 45°, except for one angular area. Because the maximum angle of advance is 60° which is larger than the above angular interval of 45°, the stage in which ignition is performed varies as the angle of advance is changed, i.e., the ignition timing is moved from stage to stage. The pulse count PA varies at the time the ignition timing is thus moved even if the pulse signal generating mechanism functions normally. In view of this, the following judgement will be made:

When the pulse count PA is 5: When the engine speed Ne is increased from the condition in which one pulse as described above with reference to the pulse count PA of "6" is not detected so that the ignition timing is moved to the preceding stage, ignition timing control is normal and the condition in which the PC1 pulse count PA is "5" occurs once. However, such condition cannot occur successively twice insofar as the ignition timing control device functions properly. If the pulse count PA of "5" is detected successively twice as in the case 2 of the table 3, the output timing of the ignition timing control device is determined as abnormal.

When the pulse count PA is "8": When the ignition timing is transferred from the 5th stage due to an abrupt reduction in the ending speed Ne to the 6th stage and then to the 7th stage, the condition in which the pulse count PA is "8" is counted successively twice. As long as the ignition timing control device operates normally, the pulse count PA of "8" cannot be counted successively three times. Therefore, if the pulse count PA of "8" is detected successively three times as in the case 5 of the table 3, the output timing of the ignition timing control device is judged as abnormal.

When the pulse count PA is "9": The pulse count PA becomes "9" when the ignition timing is transferred from the 5th stage due to an abrupt reduction in the engine speed Ne to the 7th stage. As long as the ignition timing control device operates normally, the pulse count PA of "9" cannot be counted successively twice. Therefore, if the pulse count PA of "9" is detected successively twice as in the case 6 of the table 3, the output timing of the ignition timing control device is judged as abnormal.

The pulse count PA of "10" or more occurs as when the input circuit picks up high-voltage noise or the like as a pulse signal. If the pulse count PA is "10" or more in the latest completed cycle, such a condition is determined as an operation failure or abnormality of the ignition timing control device regardless of the pulse counts in the second and third latest ignition cycles as indicated in the case 7 of the table 3.

The fail-safe circuit 30 for effecting the above decisions will be described in detail with reference to FIG. 12. The fail-safe circuit 30 has circuits for counting the PC1 pulses, for latching PC1 pulse counts PA, for determining whether three pulse counts PA are in a prescribed relationship, and for outputting a reset signal when the output timing is judged as abnormal. More specifically, a binary counter 83 for counting PC1 pulses has an input terminal 83a coupled to a PC1 pulse input line 84. The fale-safe circuit 30 has an ignition signal input terminal 85 and an ST signal input terminal 86. An ignition signal and an ST signal from these terminals 85, 86 are applied to an OR gate 87 which has its output terminal couped to a reset terminal R of the binary counter 83. The binary counter 83 is a 4-bit binary counter having 4 output terminals 01 through 04 each for producing a high or low level dependent on the information carried by the corresponding bit. The fail-safe circuit 30 also includes first and second registers 88, 89 for storing counts of the counter 83. Each of the first and second registers 88, 89 comprises four flip-flops for storing 4-bit data. Each of the flip-flops comprises a D-type flop-flop having an input terminal, a clock terminal, a Q output terminal, and a $\overline{Q}$ output terminal. In the D-type flip-flop, when the level of a signal applied to the clock terminal becomes "1", the output level of the Q output terminal is equal to the level of the input signal applied to the input terminal, and the output level of the $\overline{Q}$ output terminal is different from the input signal level. These output signal levels are maintained while the input level of the clock terminal is "0". The clock terminals of the four flip-flops are connected in common, so that each register has four input terminals D1 through D4, four Q output terminals Q1 through Q4, four $\overline{Q}$ output terminals $\overline{Q}1$ through $\overline{Q}4$, and one clock terminal CK. The intput terminals D1 through D4 of the first register 88 are coupled respectively to the output terminals 01 through 04 of the counter 83. Therefore, the count of the counter 83 can be transferred to the first register 88. The Q output terminals Q1 through Q4 of the first register 88 are connected respectively to the input terminals D1 through D4 of the second register 89 for transferring the stored count of the first register 88 to the second register 89. The fail-safe circuit 30 has input terminals 90, 91 respectively for receiving a latch signal for a count PA in the latest cycle and a latch signal for a count PA in the second latest cycle. The intput terminal 90 is connected through a two-input OR gate 82 to the clock terminal CK of the first register 88, and the input terminal 91 is connected via another two-input OR gate 81 to the clock terminal CK of the second register 89. The two-input OR gates 82, 81 have other input terminals connected through a three-input OR gate 80 to input terminals for receiving a power-on reset signal POR which is generated immediately after the engine ignition switch is turned on, a reset signal RESET (described later), and a watchdog timer clear signal W/TCLR for clearing the program executed in the CPU 22 upon runaway thereof.

The binary outputs appearing on the Q output terminals of the counter 83 and the first and second registers 88, 98 as they receive the pulse count PA are shown in the following table 4:

TABLE 4

| Counter output terminal | Register output terminal | Pulse count PA | | | | | | | | | | |
|---|---|---|---|---|---|---|---|---|---|---|---|---|
| | | 0 | 1 | 2 | 3 | 4 | 5 | 6 | 7 | 8 | 9 | 10 |
| 01 | Q4 | 0 | 1 | 0 | 1 | 0 | 1 | 0 | 1 | 0 | 1 | 0 |
| 02 | Q3 | 0 | 0 | 1 | 1 | 0 | 0 | 1 | 1 | 0 | 0 | 1 |
| 03 | Q2 | 0 | 0 | 0 | 0 | 1 | 1 | 1 | 1 | 0 | 0 | 0 |
| 04 | Q1 | 0 | 0 | 0 | 0 | 0 | 0 | 0 | 0 | 1 | 1 | 1 |

In order to determine whether the output timing is abnormal or not according to the table 3 from the outputs shown in the table 4, the counter 83 and the first and second registers 88, 89 are connected to the following circuits:

A binary comparator 53 is connected to the output terminals 01 through 04 for ascertaining whether the pulse count PA is larger than "4" or not. The binary comparator 53 has pulse count PA input terminals A0 through A3 connected to the output terminals 01 through 04 of the counter 83, and terminals B0 through B3 for setting a comparision setting value "4". The terminals B0 through B3 set a binary number "0100" corresponding to decimal "4" with "1" applied to the B2 terminal and "0" to the other terminals. When the pulse count PA applied to the input terminals A0 through A3 is not larger than the setting "4", a "" signal is issued from the output terminal 53a of the binary comparator 53.

A group of AND gates for decoding the binary outputs (see the table 4) from the counter 83 and the first and second registers 88, 89, and logic circuits for processing the outputs from these AND gates are arranged as follows in order to detect a failure of the ignition timing control device when the count of the counter 83 is "5" or higher as in the cases 2 through 7 of the table 3. The parenthesized numerals in the AND gates indicate the numbers to be processed by the AND gates, respectively.

4-input AND gates 54, 55 serve to decode the binary outputs (see the table 4) corresponding to "4" from the counter 83 and the first register 88 and to output "1". To the four input terminals of the AND gate 54, there are connected the output terminals 01, 03 of the counter 83 directly and the output terminals 02, 04 thereof via inverters 58b, 58d, respectively. The output terminals $\overline{Q1}$, Q2, $\overline{Q3}$, Q4 of the first register 88 are connected respectively to the four input terminals of the AND gate 55.

4-input AND gates 56, 57 serve to decode the binary outputs (see the table 4) corresponding to "5" from the counter 83 and the first register 88 and to output "1". To the four input terminals of the AND gate 56, there are connected the output terminals 01, 04 of the counter 83 directly and the output terminals 02, 03 thereof via inverters 58b, 58c, respectively. The output terminals Q1, $\overline{Q2}$, Q3, $\overline{Q4}$ of the first register 88 are connected respectively to the four input terminals of the AND gate 57.

4-input AND gates 59, 60, 61 serve to decode the binary outputs (see the table 4) corresponding to "6" and to output "1". To the four input terminals of the AND gate 59, there are connected the output terminals 02, 03 of the counter 83 directly and the output terminals 01, 04 thereof via inverters 58a, 58d, respectively.

The output terminals $\overline{Q1}$, Q2, Q3, $\overline{Q4}$ of the first register 88 are connected respectively to the four input terminals of the AND gate 60. The output terminals $\overline{Q1}$, Q2, Q3, $\overline{Q4}$ of the second register 89 are connected respectively to the four input terminals of the AND gate 61. The output terminal of the AND gate 60 and the output terminal of the AND gate 61 are connected respectively to the two input terminals of an AND gate 62.

4-input AND gates 63, 64, 65 serve to decode the binary outputs (see the table 4) corresponding to "8" and to output "1". To the four input terminals of the AND gate 63, there are connected the output terminal 04 of the counter 83 directly and its output terminals 01, 02, 03 via inverters 58a, 58b, 58c, respectively. The outputs Q1, $\overline{Q2}$, Q3, $\overline{Q4}$ of the first register 88 are connected respectively to the four input terminals of the AND gate 64. The output terminals Q1, $\overline{Q2}$, Q3, $\overline{Q4}$ of the second register 89 are connected respectively to the four input terminals of the AND gate 65. The output terminal of the AND gate 64 and the output terminal of the AND gate 65 are connected respectively to the two input terminals of an AND gate 66.

3-input AND gates 67, 68 serve as decoders for outputting "1" immediately before the pulse count PA counted by the counter 83 changes from "10" to "11". One of the three input terminals of the AND gate 68 is connected to the output terminal 02 of the counter 83, and the remaining two input terminals of the AND gate 68 are connected to the output terminals 01, 03 of the counter 83 via the inverters 58a, 58c. The three input terminals of the AND gate 68 are connected to the PC1 pulse input line 84, the output terminal of the AND gate 67, and the output terminal 04 of the counter 83. When the pulse count PA of the counter 83 is "10", "1" is applied to each of the intput terminals of the AND gate 68 except the intput terminal connected to the input line 84, so that the AND gate 68 is in a standby condition. When the 11th pulse from the start of pulse counting is generated on the input line 84, the AND gate 68 issues "1" during a short period of time until "1" appears on the output terminal 01 of the counter 83.

and second logic circuits 69, 70 are provided for issuing "1" when the numerical relationship shown in the table 3 is established between the pulse counts PA in the latest, second latest, and third latest ignition cycles based on the outputs from the AND gates. Each of the first and second logic circuits 69, 70 comprises two AND gates and a NOR gate having two input terminals coupled respectively to the output terminals of the AND gates. Each of the AND gates has two input terminals. The input terminals of one of the AND gates are first and second input terminals of the logic circuit, while the input terminals of the other AND gate are third and fourth input terminals thereof. The output terminal of the NOR gate serves as the output terminal of the logic circuit.

The first and second input terminals 69a, 69b of the first logic circuit 69 are connected respectively to the output terminals of the AND gates 55, 54. These AND gates 55, 54 issue "1" when the pulse counts of the first register and the counter are "5". The third and fourth input terminals 69c, 69d of the first logic circuit 69 are connected respectively to the output terminals of the AND gates 57, 56. These AND gates 57, 56 issue "1" when the pulse counts of the first register and the counter are "9". With this arrangement, the first logic circuit 69 issue "0" only when the pulse count PA of "5" is detected successively twice and only when the pulse count PA of "9" is detected successively twice.

The second logic circuit 70 has its first input terminal 70a grounded and hence supplied with "0", and its second input terminal 70b connected to the output terminal of the AND gate 59. The AND gate 59 issues "1" when the pulse count of the counter is "6". The second logic circuit 70 has its third and fourth input terminals 70c, 70d connected respectively to the output terminals of the AND gates 66, 63. The second logic circuit 70 issues "0" only when the pulse count PA is detected successively three times. The first input terminal 70a is grounded for the following reason: The output terminal of the AND gate 62 is not connected to any terminal. If the first input terminal 70a of the second logic circuit 70 were connected to the output terminal of the AND gate 62, the second logic circuit 70 would produce "0" when the pulse count PA of "6" is detected successively three times. Since the pulse count PA of "6" can be detected successively three times even when the disclosed ignition timing control device operates normally, the output terminal of the AND gate 62 is not connected to the first input terminal 70a of the second logic circuit 70. However, the output terminal of the AND gate 62 may be connected to the first input terminal 70a of the second logic circuit 70 in such an ignition timing control device in which the pulse count PA of "6" cannot be detected successively three times while the device is functioning properly.

A three-input OR gate 71 serving as a reset signal output circuit, a D-type flip-flop 72, and a two-input OR gate 76 are connected to the first and second logic circuits 69, 70. The OR gate 71 has three input terminals connected to the output terminal 53a of the comparator 53, and the output lines from the first and second logic circuits 69, 70 via respective inverters 58e, 58f.

The OR gate 71 has an output terminal coupled to the D input terminal of the flip-flop 72 with its Q output terminal connected to one of the two input terminals of the OR gate 76. The other input terminal of the OR gate 76 is connected to the output terminal of the AND gate 68. The OR gate 76 has an output terminal for delivering a reset signal to an output terminal 77 for setting the CPU 22. An input terminal 73 supplies a pulse signal (described later) serving as a fail detecting timing signal, and an input terminal 74 supplies an ST signal (described later). These input terminals 73, 74 are connected respectively to the input terminals of a two-input AND gate 75, the output terminal thereof being coupled to the clock terminal CK of the flip-flop 72.

A fail reset circuit 78 receives an output signal from the Q output terminal of the flip-flop 72, i.e., a reset signal produced when the output timing is judged as abnormal. The fail reset circuit 78 delivers a resetting signal through a three-input OR gate 79 to the flip-flop 72 upon elapse of a predetermined period of time in which a prescribed number of clock pulses are counted after the reset signal has been applied. The other two input terminals of the OR gate 79 are connected to input terminals for the power-on reset signal POR and the watchdog timer clear signal W/TCLR, as described above.

Operation of the fail-safe circuit 30 will now be described.

When the engine ignition switch is turned on, the ECU 2 of FIG. 1 is energized. Immediately thereafter, the $\overline{ST}$ signal of level "1" is issued and the supplied voltage reaches a predetermined level, whereupon one pulse of the power-on reset signal POR is issued. The $\overline{ST}$ signal initially resets the counter 83, and the POR signal is applied to the CK terminals of the first and second registers 88, 89 to enable them to read the pulse count PA. Since the counter 83 has just been reset by the $\overline{ST}$ signal, the contents of the first and second registers 88, 89 are cleared to "0". The POR signal is also applied to the flip-flop 72 to reset same.

When the initialization of the CPU 22, e.g., clearing of the registers and setting of the variables to initial values is completed, the CPU 22 issues an ST signal of level "1". Until the initialization of the CPU 22 is completed, the ST signal remains level "0", and the $\overline{ST}$ signal which is an inversion of the ST signal is of level "1", as described above. In response to the ST signal applied after the initialization is completed, the two-input AND gate 75 is kept in a standby condition. When PC1 pulses appear on the input line 84, the counter 83 starts counting the PC1 pulses, and changes the output levels of the output terminals 01 through 04 as shown in the table 4 each time a PC1 pulse is applied thereto.

The I/O LSI 21 includes a synchronizing pulse generator circuit (not shown) having an input terminal and four output terminals. The intput terminal of the synchronizing pulse generator circuit is coupled to the output line of the second comparator 41b of the first ignition counter circuit 36. When the output from the second comparator 41b goes high, the synchronizing pulse generator circuit issues four pulse signals successively from the output terminals thereof within a short period of time. These four pulse signals will hereinafter be referred to as first through fouth pulses in order of issuance. The output timing of these first through fourth pulses is illustrated in the timing chart of FIG. 13. The first pulse is applied to the input terminal of the AND gate 75, whereupon the "1" level is supplied to the clock terminal CK of the flip-flop 72. While the "1" level is being applied to the clock terminal CK of flip-flop 72, the output signal of the Q output terminal thereof is kept at the "0" level when the input to the D input terminal is of the "0" level, i.e., the pulse counts in the latest, second latest, and third latest ignition cycles as shown in the table 3 are not in the prescribed numerical relationship. Then, the second pulse is fed to the clock terminal CK of the second register 89 via the OR gate 81. In timed relation to the second pulse applied to the clock terminal CK of the second register 89, the pulse count latched in the first register 88 is transferred to the second register 89, which then latches the transferred pulse count as the pulse count PA in the second latest ignition cycle. Thereafter, the third pulse is applied to the clock terminal CK of the first register 88, and in timed relation to the third pulse, the pulse count counted by the counter 83 is transferred to the first register 88 and latched therein as the pulse count in the latest ignition cycle. Immediately after the pulse count has been latched in the first register 88, the fourth pulse is generated to reset the counter 83, which then starts counting new PC1 pulses.

When the pulse counts in the latest, second latest, and third latest ignition cycles reach the numerical relationship as indicated in the cases 1, 2, 5, 6, and 7 of the table 3, the fail-safe circuit 30 operates as follows: If the pulse count PA is "4" or less as indicated in the case 1 of the table 3, the output terminal 53a of the comparator 53 issues a "1" signal that is delivered via the OR gate 71 to the D input terminal of the flip-flop 72. When the pulse count "5" as indicated in the case 2 of the table 3 is detected successively twice, the AND gates 54, 55 issue "1" signals which are applied respectively to the input terminals 69a, 69b of the first logic circuit 69. The logic circuit 69 then applies a "0" signal to the inverter 58e which inverts the applied signal to a "1" signal that is led via the OR gate 71 to the D input terminal of the flip-flop 72. Where the numerical relationship is established as indicated in the cases 5, 6, and 7 of the table 3, a "1" signal is similarly applied to the D terminal of the flip-flop 72. Therefore, at the same time that the fourth pulse is generated, a "1" signal is applied to the clock terminal CK of the flip-flop 72, which issues a "1" signal serving as an abnormality signal from its Q output terminal. In response to the "1" signal from the Q output terminal, the OR gate 76 issues a reset signal to reset the CPU 22.

Thus, the abnormal condition of the output timing of the ignition timing control device can accurately be detected without error based on the latest and previous pulse counts.

When the CPU 22 is reset by the reset signal, the CPU 22 inverts the ST signal to "0" and the $\overline{ST}$ signal to "1". Immediately after the ignition switch has been turned on, the counter 83 is reset by the inverted $\overline{ST}$ signal. The reset signal is also supplied through the OR gate 80 to the clock terminals CK of the first and second registers 88, 89 to reset the contents thereof to zero. Upon elapse of a given period of time after the CPU 22, the counter 83, and the registers 88, 89 have been reset, the flip-flop 72 is reset by a fail reset signal from the fail reset circuit 78, and the reset signal to the output terminal 77 is eliminated. The resetting of the CPU 22 is now cancelled. The fail reset signal is also supplied to the reset terminals R of the SR flip-flops 50 in the first and second ignition counter circuit 36, 37 to reset the counts of the first and second counters 39a, 39b to zero and also to invert the outputs of the Q output terminals of the flip-flops 50 to the "0" level, so that no clock signal will pass through the AND gate 49. The first and second counters 39a, 39b will not start counting clock pulses until a next starting signal is applied.

The AND gate 75 is brought again into the standby condition by the ST signal. When ignition is to be interrupted after the ignition coils 45, 46 have been energized, the currents flowing through the primary windings of the ignition coils are gradually lowered to reduce electromotive forces induced across the secondary windings, so that ignition sparks will be prevented from being produced by the ignition plugs 10a, 10b.

The hardware described above can be applied to other engine types without any substantial modification except alternation of the arrangement of the two pulsers, and with a slight modification of the software. The angular interval between the two pulsers is important and depends on the interval between the top dead centers of the engine cylinders and also on the intervals at which the reactors are spaced on the rotor of the pulse signal generating mechanism. Where a pulse signal generating mechanism in which two adjacent reactors are spaced 45 degrees is employed, as disclosed herein, the pulsers are angularly spaced from each other at a certain angular interval for engines in which the interval between the top dead centers is a multiple of 45 degrees, while the pulsers are angularly spaced from each other at a different angular interval for engines in which the interval between the top dead centers is not a multiple of 45 degrees. For engines in which the interval between the top dead centers is very close to, but not exactly the same as, a multiple of 45 degrees, the present invention is more easily applicable to such engines by changing the angular interval between two adjacent reactors.

For engines of the same V-type configuration as disclosed herein in which the interval between the top dead centers is not a multiple of 45 degrees, the angular interval between the pulsers may be equal to the interval between the top dead centers. For example, as shown in FIG. 7, the number (which is "4" in the step 604) to be compared with the variable STG in various steps such as the step 604 for checking the variable STG is appropriately selected to utilize the same software as disclosed herein. Since the number to be compared is stored as data in the ROM in the CPU, the ignition timing control device may be adapted to various engines simply by changing the data.

Figure 15:
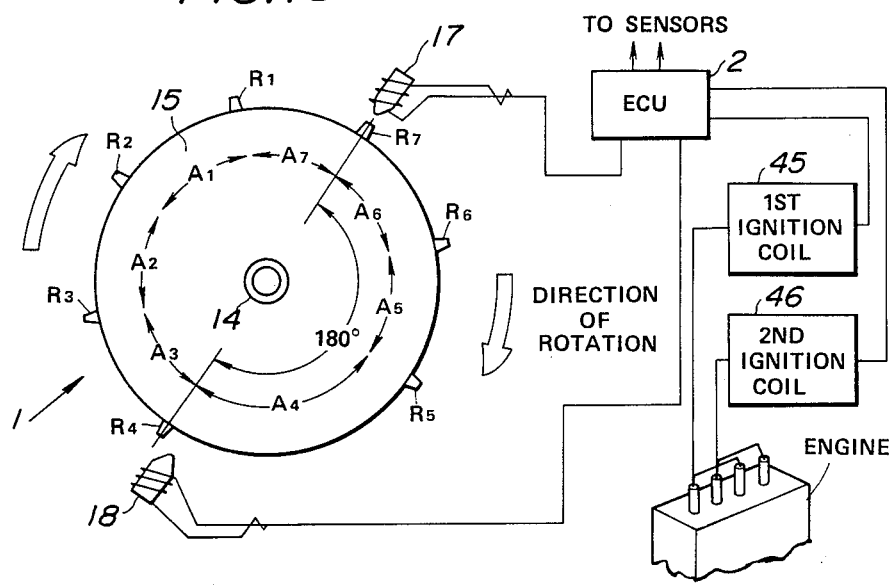
FIG. 15 is an enlarged view showing the positional relationship between reactors and pulsers of a pulse signal generating mechanism in an electronic ignition timing control device employed to carry out a modification of the method described with reference to FIGS. 1 through 14.

For engines of the same V-type configuration as disclosed herein in which the interval between the top dead centers is a multiple of 45 degrees, or engines with in-line cylinders, the angular interval between the pulsers may be selected to be substantially a multiple of 45 degrees but deviate slightly therefrom, irrespective of the actual interval between the top dead centers. FIG. 15 shows an ignition timing control device for an in-line four-stroke engine with four cylinders. The interval between the top dead centers is 180 degrees, whereas the second pulser 18 is angularly spaced from the first pulser 17 by an angle which is substantially equal to, but slightly different form, 180 degrees. The first and second pulsers may be angularly spaced an angle which is substantially equal to 90 degrees or 135 degrees, but such an angle should slightly deviate therefrom. Such an angle deviation should occur in the direction in which the second pulser 18 generates the PC2 pulse immediately before the first pulser 18 generates the PC1 pulse, and the amount of such an angular deviation should be large enough to ensure that the PC2 pulse is produced prior to the PC1 pulse. If the PC2 pulse were generated after the PC1 pulse, and the second pulser 18 confronted the fourth area A4, then the ECU 2 would be likely to make an erroneous judgment. The above angular deviation serves to prevent such an erroneous judgment from arising. Where the pulsers are disposed in the above arrangement, the fixed ignition control subroutine should be somewhat modified in addition to altering the data to be compared with the variable STG. More specifically, the first and second coils 45, 46 are energized such that they will fire the respective ignition plugs for fixed ignition in response to detection of the PC1 pulse. This process can be achieved simply by changing the step 638 in FIG. 14 so that it can check the output of the first flip-flop rather than the output of the second flip-flip. FIG. 16 is a timing chart of signals generated in such fixed ignition control. The timing chart of FIG. 16 is believed to aid in understanding the above process.

It will easily be understood from the foregoing disclosure that the ignition timing control device of the invention can also be applied to 2-cylinder engines of any desired types. A simplified version of the disclosed ignition timing control device can also be applied to single-cylinder engines. Insofar as the limitations imposed by the speed of arithmetic operations effected by the CPU are acceptable, the disclosed apparatus can be adapted to multicylinder engines of any types simply by adding ignition coils.

Although there have been described what are at present considered to be the preferred embodiments of the present invention, it will be understood that the invention may be embodied in other specific forms without departing from the spirit or essential characteristics thereof The present embodiments are therefore to be considered in all aspects as illustrative, and not restrictive. The scope of the invention is indicated by the appended claims rather than by the foregoing description.

We claim:

1. A method of examining operation of an electronic control system for an internal combustion engine having a crankshaft, said electronic control system having a mechanism for generating indicative pulse signals indicative of angular position of said crankshaft and means for evaluating said indicative pulse signals so as to output control pulse signals for controlling an engine operation-related factor, said mechanism for generating indicative pulse signals generating each said indicative pulse signal at a time when said crankshaft is at one of predetermined angular positions, said means for evaluating outputting each said control pulse signal when said crankshaft is at a desired angular position, said method comprising the steps of:

counting continuously said indicative pulse signals so as to generate a succession of counted numbers, each said counted number representing the number of said indicative pulse signals continuously generated during a time from an occurrence of one said control pulse signal to an occurrence of next said control pulse signal, each said counted number varying dependent upon operating conditions of said engine, and varying the timing of the outputs of said control pulse signal by said means for evaluating according to said varying counted numbers;

testing whether or not said succession of counted numbers meets one of predetermined conditions by comparing a combination of the latest counted numbers with predetermined combination of numbers; and evaluating results of said testing so as to examine operation of said control system.

2. A method according to claim 1, wherein said engine operation-related factor controlled by said control system is ignition timing, said control pulse signals are ignition command signals for said ignition timing, and said evaluating step includes the step of preventing said ignition command signals in accordance with said testing.

3. A method according to claim 1, wherein said testing step is the step of comparing a combination of the latest three of said counted numbers with predetermined combinations of numbers.

4. A method of examining operation of an electronic control system for an internal combustion engine having a crankshaft, said electronic control system having a mechanism for generating indicative pulse signals indicative of angular position of said crankshaft and means for evaluating said indicative pulse signals so as to output conrol pulse signals for controlling an engine operation-related factor, said mechanism for generating indicative pulse signals generating each said indicative pulse signal at a time when said crankshaft is at one of a plurality of predetermined angular positions, said means for evaluating outputting each said control pulse signal when said crankshaft is at a desired angular position, said method comprising the steps of:

detecting a reference crank angle position;

calculating a time Te required for the crankshaft to make its last revolution;

storing the calculated time Te;

determining present rotational speed of the engine Ne and which one of several predetermined engine speed ranges the present rotational speed Ne of the engine falls within;

setting flags according to the speed range in which Ne falls;

calculating and storing a suitable angle of advance $\theta ig$;

calculating and storing a continuous current supply time Ton during which current is continuously supplied to an ignition coil; and calculating current supply starting timing data Tcg and ignition timing data Tig based on the angle of advance $\theta ig$ and the continuous current supply time Ton.

* * * * *

UNITED STATES PATENT AND TRADEMARK OFFICE
CERTIFICATE OF CORRECTION

PATENT NO.   : 4,887,215

DATED        : December 12, 1989

INVENTOR(S)  : Chiaki Kumagai et al.

It is certified that error appears in the above-identified patent and that said Letters Patent is hereby corrected as shown below:

TITLE PAGE:

The following name was omitted as an Assignee.

-- Oki Electric Industry Co., Ltd. --

Signed and Sealed this

Twenty-fifth Day of August, 1992

Attest:

DOUGLAS B. COMER

Attesting Officer   Acting Commissioner of Patents and Trademarks